US008968829B2

(12) United States Patent
Ryu et al.

(10) Patent No.: US 8,968,829 B2
(45) Date of Patent: Mar. 3, 2015

(54) THIN FILM DEPOSITION APPARATUS AND METHOD OF MANUFACTURING ORGANIC LIGHT-EMITTING DISPLAY DEVICE BY USING THE SAME

(75) Inventors: Jae-Kwang Ryu, Yongin (KR); Hyun-Sook Park, Yongin (KR); Yun-Mi Lee, Yongin (KR); Jong-Heon Kim, Yongin (KR); Sang-Soo Kim, Yongin (KR); Ji-Sook Oh, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 839 days.

(21) Appl. No.: 12/862,125

(22) Filed: Aug. 24, 2010

(65) Prior Publication Data
US 2011/0053300 A1 Mar. 3, 2011

(30) Foreign Application Priority Data

Aug. 25, 2009 (KR) .................. 10-2009-0078838
Feb. 16, 2010 (KR) .................. 10-2010-0013848

(51) Int. Cl.
| | | |
|---|---|---|
| C23C 16/00 | (2006.01) | |
| H01L 51/56 | (2006.01) | |
| C23C 14/24 | (2006.01) | |
| C23C 14/04 | (2006.01) | |
| C23C 14/12 | (2006.01) | |
| C23C 14/56 | (2006.01) | |
| H01L 27/32 | (2006.01) | |
| H01L 51/00 | (2006.01) | |

(52) U.S. Cl.
CPC ............. *C23C 14/243* (2013.01); *C23C 14/042* (2013.01); *C23C 14/12* (2013.01); *C23C 14/562* (2013.01); *H01L 27/3244* (2013.01); *H01L 51/0011* (2013.01); *H01L 51/56* (2013.01)

USPC ........................................ 427/248.1; 118/715

(58) Field of Classification Search
None
See application file for complete search history.

(56) References Cited

U.S. PATENT DOCUMENTS

| | | |
|---|---|---|
| 4,416,217 A | 11/1983 | Nakamura et al. |
| 4,468,648 A | 8/1984 | Uchikune |
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

English-language abstract of Korean Publication No. KR 10-2002-0034272.

(Continued)

*Primary Examiner* — Joseph Miller, Jr.
(74) *Attorney, Agent, or Firm* — Christie Parker & Hale, LLP

(57) ABSTRACT

A thin film deposition apparatus that can be applied to manufacture large-sized display devices on a mass scale and that improves manufacturing yield, and a method of manufacturing an organic light-emitting display device by using the thin film deposition apparatus.

17 Claims, 21 Drawing Sheets

(56) References Cited

U.S. PATENT DOCUMENTS

| | | | |
|---|---|---|---|
| 5,909,995 A | 6/1999 | Wolf et al. | |
| 6,091,195 A | 7/2000 | Forrest et al. | |
| 6,099,649 A | 8/2000 | Schmitt et al. | |
| 6,274,198 B1 | 8/2001 | Dautartas | |
| 6,280,821 B1 | 8/2001 | Kadunce et al. | |
| 6,371,451 B1 | 4/2002 | Choi | |
| 6,417,034 B2 | 7/2002 | Kitazume et al. | |
| 6,443,597 B1 | 9/2002 | Natori | |
| 6,483,690 B1 | 11/2002 | Nakajima et al. | |
| 6,541,130 B2 | 4/2003 | Fukuda | |
| 6,554,969 B1 | 4/2003 | Chong | |
| 6,579,422 B1 | 6/2003 | Kakinuma | |
| 6,589,673 B1 | 7/2003 | Kido et al. | |
| 6,650,023 B2 | 11/2003 | Kim | |
| 6,699,324 B1 | 3/2004 | Berdin et al. | |
| 6,749,906 B2 | 6/2004 | Van Slyke | |
| 6,776,847 B2 | 8/2004 | Yamazaki et al. | |
| 6,837,939 B1 | 1/2005 | Klug et al. | |
| 6,878,209 B2 | 4/2005 | Himeshima et al. | |
| 6,946,783 B2 * | 9/2005 | Kim | 313/402 |
| 6,995,035 B2 | 2/2006 | Cok et al. | |
| 7,006,202 B2 | 2/2006 | Byun et al. | |
| RE39,024 E | 3/2006 | Takahashi | |
| 7,078,070 B2 | 7/2006 | Peng | |
| 7,199,520 B2 | 4/2007 | Fujii et al. | |
| 7,322,248 B1 | 1/2008 | Long | |
| 7,495,389 B2 | 2/2009 | Noguchi et al. | |
| 7,601,439 B2 | 10/2009 | Chun et al. | |
| 7,776,457 B2 | 8/2010 | Lee et al. | |
| 7,872,256 B2 | 1/2011 | Sung et al. | |
| 7,910,386 B2 | 3/2011 | Shiang et al. | |
| 7,964,037 B2 | 6/2011 | Fukuda et al. | |
| 8,022,448 B1 | 9/2011 | Luu et al. | |
| 8,128,753 B2 | 3/2012 | Bulovic et al. | |
| 8,137,466 B2 | 3/2012 | Kang et al. | |
| 8,188,476 B2 | 5/2012 | Takagi et al. | |
| 8,193,011 B2 | 6/2012 | Kang et al. | |
| 8,673,077 B2 | 3/2014 | Sonoda et al. | |
| 2001/0004186 A1 | 6/2001 | Song et al. | |
| 2001/0006827 A1 | 7/2001 | Yamazaki et al. | |
| 2001/0019807 A1 | 9/2001 | Yamada et al. | |
| 2001/0026638 A1 | 10/2001 | Sangu et al. | |
| 2001/0034175 A1 | 10/2001 | Miyazaki et al. | |
| 2002/0011785 A1 | 1/2002 | Tang et al. | |
| 2002/0017245 A1 | 2/2002 | Tsubaki et al. | |
| 2002/0033136 A1 | 3/2002 | Savage et al. | |
| 2002/0076847 A1 | 6/2002 | Yamada et al. | |
| 2002/0168577 A1 | 11/2002 | Yoon | |
| 2002/0179013 A1 | 12/2002 | Kido et al. | |
| 2002/0187253 A1 | 12/2002 | Marcus et al. | |
| 2002/0194727 A1 | 12/2002 | Cho et al. | |
| 2002/0197393 A1 | 12/2002 | Kuwabara | |
| 2003/0101932 A1 | 6/2003 | Kang | |
| 2003/0101937 A1 | 6/2003 | Van Slyke et al. | |
| 2003/0117602 A1 | 6/2003 | Kobayashi et al. | |
| 2003/0118950 A1 | 6/2003 | Chao et al. | |
| 2003/0124764 A1 | 7/2003 | Yamazaki et al. | |
| 2003/0151637 A1 | 8/2003 | Nakamura et al. | |
| 2003/0164934 A1 | 9/2003 | Nishi et al. | |
| 2003/0168013 A1 | 9/2003 | Freeman et al. | |
| 2003/0173896 A1 | 9/2003 | Grushin et al. | |
| 2003/0221614 A1 | 12/2003 | Kang et al. | |
| 2003/0221620 A1 | 12/2003 | Yamazaki | |
| 2003/0232563 A1 | 12/2003 | Kamiyama et al. | |
| 2004/0016907 A1 | 1/2004 | Shi | |
| 2004/0029028 A1 | 2/2004 | Shimizu | |
| 2004/0056244 A1 | 3/2004 | Marcus et al. | |
| 2004/0086639 A1 * | 5/2004 | Grantham et al. | 427/248.1 |
| 2004/0096771 A1 | 5/2004 | Kashiwagi et al. | |
| 2004/0115338 A1 | 6/2004 | Yoneda | |
| 2004/0115342 A1 | 6/2004 | Shigemura | |
| 2004/0123804 A1 | 7/2004 | Yamazaki et al. | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0157167 A1 | 8/2004 | Morii | |
| 2004/0183435 A1 | 9/2004 | Ohshita | |
| 2004/0194702 A1 | 10/2004 | Sasaki et al. | |
| 2004/0195530 A1 | 10/2004 | Kwak et al. | |
| 2004/0216673 A1 | 11/2004 | Sakata et al. | |
| 2004/0255857 A1 | 12/2004 | Chow et al. | |
| 2004/0263547 A1 | 12/2004 | Sugahara | |
| 2004/0263771 A1 | 12/2004 | Jeong et al. | |
| 2005/0001546 A1 | 1/2005 | Yamaguchi | |
| 2005/0016461 A1 * | 1/2005 | Klug et al. | 118/726 |
| 2005/0031836 A1 | 2/2005 | Hirai | |
| 2005/0037136 A1 | 2/2005 | Yamamoto | |
| 2005/0039684 A1 | 2/2005 | Yi et al. | |
| 2005/0072359 A1 | 4/2005 | Kim | |
| 2005/0072361 A1 | 4/2005 | Yang et al. | |
| 2005/0079418 A1 | 4/2005 | Kelley et al. | |
| 2005/0110400 A1 | 5/2005 | Nakamura | |
| 2005/0118788 A1 | 6/2005 | Kuwahara et al. | |
| 2005/0129489 A1 | 6/2005 | Quan et al. | |
| 2005/0153472 A1 | 7/2005 | Yotsuya | |
| 2005/0166842 A1 | 8/2005 | Sakamoto | |
| 2005/0166844 A1 | 8/2005 | Gralenski | |
| 2005/0183670 A1 | 8/2005 | Grantham et al. | |
| 2005/0186330 A1 | 8/2005 | Kim et al. | |
| 2005/0213021 A1 | 9/2005 | Myoung | |
| 2005/0217584 A1 | 10/2005 | Abiko et al. | |
| 2005/0229848 A1 | 10/2005 | Shinriki et al. | |
| 2005/0244580 A1 | 11/2005 | Cok et al. | |
| 2005/0263074 A1 | 12/2005 | Masuda et al. | |
| 2006/0011136 A1 | 1/2006 | Yamazaki et al. | |
| 2006/0012771 A1 | 1/2006 | Jeong | |
| 2006/0022590 A1 | 2/2006 | Aziz et al. | |
| 2006/0040132 A1 | 2/2006 | Liao et al. | |
| 2006/0045958 A1 | 3/2006 | Abiko et al. | |
| 2006/0066231 A1 | 3/2006 | Nishikawa et al. | |
| 2006/0090705 A1 | 5/2006 | Kim | |
| 2006/0102078 A1 | 5/2006 | Fairbairn et al. | |
| 2006/0110544 A1 | 5/2006 | Kim et al. | |
| 2006/0113907 A1 | 6/2006 | Im et al. | |
| 2006/0115585 A1 | 6/2006 | Bulovic et al. | |
| 2006/0130766 A1 | 6/2006 | Kim et al. | |
| 2006/0144325 A1 | 7/2006 | Jung et al. | |
| 2006/0152641 A1 | 7/2006 | Brody | |
| 2006/0164786 A1 | 7/2006 | Kobayashi et al. | |
| 2006/0169211 A1 | 8/2006 | Kim et al. | |
| 2006/0174829 A1 | 8/2006 | An et al. | |
| 2006/0205101 A1 | 9/2006 | Lee et al. | |
| 2006/0244696 A1 | 11/2006 | Jung et al. | |
| 2006/0267294 A1 | 11/2006 | Busse et al. | |
| 2006/0269671 A1 | 11/2006 | Kim et al. | |
| 2006/0272572 A1 | 12/2006 | Uematsu et al. | |
| 2006/0278522 A1 | 12/2006 | Kim et al. | |
| 2006/0278945 A1 | 12/2006 | Sakurai | |
| 2006/0280588 A1 | 12/2006 | Blonigan et al. | |
| 2007/0009552 A1 | 1/2007 | Whitehead et al. | |
| 2007/0009652 A1 | 1/2007 | Manz et al. | |
| 2007/0017445 A1 | 1/2007 | Takehara et al. | |
| 2007/0022955 A1 * | 2/2007 | Bender et al. | 118/726 |
| 2007/0024185 A1 | 2/2007 | Kitamura et al. | |
| 2007/0046185 A1 | 3/2007 | Kim | |
| 2007/0046913 A1 | 3/2007 | Shibazaki | |
| 2007/0054044 A1 | 3/2007 | Shimosaki et al. | |
| 2007/0075955 A1 | 4/2007 | Jung et al. | |
| 2007/0077358 A1 | 4/2007 | Jeong et al. | |
| 2007/0148337 A1 | 6/2007 | Nichols et al. | |
| 2007/0148348 A1 | 6/2007 | Huh et al. | |
| 2007/0157879 A1 | 7/2007 | Yotsuya | |
| 2007/0158471 A1 | 7/2007 | Park et al. | |
| 2007/0163497 A1 * | 7/2007 | Grace et al. | 118/715 |
| 2007/0178708 A1 | 8/2007 | Ukigaya | |
| 2007/0195844 A1 | 8/2007 | Ma et al. | |
| 2007/0231460 A1 | 10/2007 | Ukigaya | |
| 2007/0275497 A1 | 11/2007 | Kwack et al. | |
| 2007/0297887 A1 | 12/2007 | Tanaka | |
| 2008/0018236 A1 | 1/2008 | Arai et al. | |
| 2008/0038935 A1 | 2/2008 | Baude et al. | |
| 2008/0057183 A1 | 3/2008 | Spindler et al. | |
| 2008/0100201 A1 | 5/2008 | Wei et al. | |

(56) References Cited

U.S. PATENT DOCUMENTS

| | | |
|---|---|---|
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0310768 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0139069 A1 | 6/2011 | Ahn et al. |
| 2011/0220019 A1 | 9/2011 | Lee et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 | 4/2004 |
| EP | 1 418 250 | 5/2004 |
| EP | 1 518 940 | 3/2005 |
| EP | 2354270 A1 | 8/2011 |
| JP | 57-194252 A2 | 11/1982 |
| JP | 2-247372 | 10/1990 |
| JP | 4-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-68054 | 3/2000 |
| JP | 2000-282219 | 10/2000 |
| JP | 2000-323277 | 11/2000 |
| JP | 2001-28325 A2 | 1/2001 |
| JP | 2001-52862 | 2/2001 |
| JP | 2001-93667 | 4/2001 |
| JP | 2002-075638 | 3/2002 |
| JP | 2002-175878 | 6/2002 |
| JP | 2002-348659 A2 | 12/2002 |
| JP | 2003-3250 | 1/2003 |
| JP | 2003-77662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |

(56) References Cited

FOREIGN PATENT DOCUMENTS

| | | |
|---|---|---|
| JP | 2003-347394 A2 | 12/2003 |
| JP | 2004-035964 A2 | 2/2004 |
| JP | 2004-43898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-44592 | 2/2005 |
| JP | 2005-101505 | 4/2005 |
| JP | 2005-122980 | 5/2005 |
| JP | 2005-163099 | 6/2005 |
| JP | 2005-165015 A2 | 6/2005 |
| JP | 2005-174843 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-242436 | 9/2007 |
| JP | 2007-291506 A2 | 11/2007 |
| JP | 2008-19477 A2 | 1/2008 |
| JP | 2008-108628 | 5/2008 |
| JP | 2008-121098 | 5/2008 |
| JP | 2008-521165 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-19243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 A2 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 10-2002-0001555 | 1/2002 |
| KR | 2002-0025760 | 4/2002 |
| KR | 10-2002-0050922 | 6/2002 |
| KR | 10-2002-0090934 | 12/2002 |
| KR | 10-2002-0091457 A | 12/2002 |
| KR | 10-2003-0001745 | 1/2003 |
| KR | 2003-0034730 A | 5/2003 |
| KR | 10-2003-0043012 A | 6/2003 |
| KR | 10-2003-0046090 | 6/2003 |
| KR | 2003-0069684 | 8/2003 |
| KR | 10-0406059 B1 | 11/2003 |
| KR | 10-2003-0091947 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 | 6/2005 |
| KR | 10-2005-0082644 A | 8/2005 |
| KR | 10-0532657 B1 | 12/2005 |
| KR | 10-2006-0008602 | 1/2006 |
| KR | 10-2006-0018745 | 3/2006 |
| KR | 2006-0020050 | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0056706 | 5/2006 |
| KR | 10-2006-0058459 | 5/2006 |
| KR | 2006-0049050 | 5/2006 |
| KR | 10-2006-0059323 A | 6/2006 |
| KR | 10-2006-0060994 | 6/2006 |
| KR | 10-2006-0065978 | 6/2006 |
| KR | 10-2006-0073367 | 6/2006 |
| KR | 2006-0059068 | 6/2006 |
| KR | 10-2006-0077887 A | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-2006-0123944 A | 12/2006 |
| KR | 10-0687007 | 2/2007 |
| KR | 10-2007-0025164 | 3/2007 |
| KR | 10-0696547 | 3/2007 |
| KR | 10-0696550 B1 | 3/2007 |
| KR | 10-0697663 B1 | 3/2007 |
| KR | 10-2007-0035796 | 4/2007 |
| KR | 10-2007-0037848 A | 4/2007 |
| KR | 10-2007-0050793 | 5/2007 |
| KR | 10-0723627 | 5/2007 |
| KR | 10-2007-0056190 A | 6/2007 |
| KR | 10-0736218 B1 | 7/2007 |
| KR | 10-0739309 B1 | 7/2007 |
| KR | 10-0741142 B1 | 7/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |

(56) References Cited

FOREIGN PATENT DOCUMENTS

| | | | |
|---|---|---|---|
| KR | 10-2007-0098122 A | 10/2007 | |
| KR | 10-2007-0105595 | 10/2007 | |
| KR | 10-0768212 B1 | 10/2007 | |
| KR | 10-0770653 | 10/2007 | |
| KR | 10-2007-0112668 | 11/2007 | |
| KR | 10-2007-0114094 A | 11/2007 | |
| KR | 10-0787457 B1 | 12/2007 | |
| KR | 10-2008-0001184 | 1/2008 | |
| KR | 10-2008-0003720 A | 1/2008 | |
| KR | 10-2008-0007896 A | 1/2008 | |
| KR | 10-2008-0009285 A | 1/2008 | |
| KR | 10-0800125 | 1/2008 | |
| KR | 10-2008-0036983 A | 4/2008 | |
| KR | 10-0823508 | 4/2008 | |
| KR | 10-0823511 B1 | 4/2008 | |
| KR | 10-2008-0044239 A | 5/2008 | |
| KR | 10-2008-0044775 | 5/2008 | |
| KR | 10-2008-0046761 A | 5/2008 | |
| KR | 10-2008-0048653 | 6/2008 | |
| KR | 10-2008-0055124 A | 6/2008 | |
| KR | 10-2008-0057159 A | 6/2008 | |
| KR | 10-2008-0060400 | 7/2008 | |
| KR | 10-2008-0061132 | 7/2008 | |
| KR | 10-2008-0061666 A | 7/2008 | |
| KR | 10-2008-0061774 A | 7/2008 | |
| KR | 10-2008-0062212 | 7/2008 | |
| KR | 10-2008-0076574 A | 8/2008 | |
| KR | 10-2008-0088737 A | 10/2008 | |
| KR | 10-2008-0104479 A | 12/2008 | |
| KR | 10-2008-0104695 A | 12/2008 | |
| KR | 10-2008-0109559 | 12/2008 | |
| KR | 10-2009-0017910 A | 2/2009 | |
| KR | 10-0889872 B1 | 3/2009 | |
| KR | 10-2009-0038733 | 4/2009 | |
| KR | 10-2009-0040618 | 4/2009 | |
| KR | 10-2009-0047953 A | 5/2009 | |
| KR | 10-2009-0052155 | 5/2009 | |
| KR | 10-2009-0052828 A | 5/2009 | |
| KR | 10-2009-0053417 | 5/2009 | |
| KR | 10-0899279 B1 | 5/2009 | |
| KR | 10-2009-0066996 A | 6/2009 | |
| KR | 10-2009-0075887 A | 7/2009 | |
| KR | 10-2009-0079765 A | 7/2009 | |
| KR | 10-2009-0081717 A | 7/2009 | |
| KR | 10-0908232 B1 | 7/2009 | |
| KR | 10-2009-0093161 | 9/2009 | |
| KR | 10-2009-0094911 A | 9/2009 | |
| KR | 10-2009-0107702 | 10/2009 | |
| KR | 10-0922763 A | 10/2009 | |
| KR | 10-2010-0000128 | 1/2010 | |
| KR | 10-2010-0000128 A | 1/2010 | |
| KR | 10-2010-0000129 | 1/2010 | |
| KR | 10-2010-0002381 A | 1/2010 | |
| KR | 10-2010-0026655 | 3/2010 | |
| KR | 10-2010-0038088 A | 4/2010 | |
| KR | 10-2010-0044606 A | 4/2010 | |
| KR | 10-0961110 B1 | 6/2010 | |
| KR | 10-2010-0090070 | 8/2010 | |
| KR | 10-2010-0099806 A | 9/2010 | |
| KR | 10-2010-0119368 A | 11/2010 | |
| KR | 10-2010-0126125 A | 12/2010 | |
| KR | 10-2010-0128589 A | 12/2010 | |
| KR | 10-2010-0130786 A | 12/2010 | |
| KR | 10-2010-0133678 A | 12/2010 | |
| KR | 10-2010-0138139 A | 12/2010 | |
| KR | 10-1017654 B1 | 2/2011 | |
| KR | 10-2011-0021090 A | 3/2011 | |
| KR | 10-2011-0022512 A | 3/2011 | |
| KR | 10-2011-0032589 A | 3/2011 | |
| KR | 10-2011-0082418 A | 7/2011 | |
| KR | 10-2011-0101767 | 9/2011 | |
| KR | 10-2011-0110525 A | 10/2011 | |
| KR | 10-2011-0120213 A | 11/2011 | |
| KR | 10-2011-0138787 A | 12/2011 | |
| KR | 10-2012-0006322 A | 1/2012 | |
| KR | 10-2012-0006324 A | 1/2012 | |
| KR | 10-2012-0012300 | 2/2012 | |
| KR | 10-2010-0047796 | 5/2012 | |
| KR | 10-2012-0042155 A | 5/2012 | |
| KR | 10-2012-0065789 A | 6/2012 | |
| KR | 10-2012-0080855 A | 7/2012 | |
| KR | 10-2012-0081811 A | 7/2012 | |
| KR | 10-1193186 B1 | 10/2012 | |
| KR | 10-2012-0131545 A | 12/2012 | |
| KR | 10-2013-0007308 A | 1/2013 | |
| WO | WO 99/25894 A1 | 5/1999 | |
| WO | 03043067 A1 | 5/2003 | |
| WO | WO2004016406 A1 | 2/2004 | |
| WO | 2008004792 A1 | 1/2008 | |

OTHER PUBLICATIONS

English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hae-Cheol Kang, et al., Samsung Mobile Display Co., Ltd.
U.S. Appl. No. 12/862,153, filed Aug. 24, 2010, Hee-Cheol Kang et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.

(56) References Cited

OTHER PUBLICATIONS

U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Appl. No. 13/031,756, filed Feb. 22, 2011, Yong Sup Choi et al., Samsung Mobile Display Co., Ltd.
KIPO Registration Determination Certificate dated Jan. 13, 2012, for Korean patent application 10-2009-0056529, 5 pages.
KIPO Office action dated Feb. 1, 2012, for Korean patent application 10-2010-0031848, 4 pages.
KIPO Registration Determination Certificate dated Sep. 28, 2011, for Korean Patent application 10-2009-0052357, 5 pages.
KIPO Registration Determination Certificate dated Nov. 25, 2011, for Korean Patent application 10-2010-0014277, 5 pages.
KIPO Office action dated Feb. 1, 2012, for Korean patent application 10-2010-0011196, 4 pages.
KIPO Registration Determination Certificate dated Jul. 20, 2012, for Korean Patent application 10-2010-0003545, (5 pages).
KIPO Registration Determination Certificate dated Apr. 30, 2012, for Korean Patent application 10-2010-0066992, (5 pages).
Japanese Office action dated Aug. 21, 2012, for Japanese Patent application 2010-145075, (5 pages).
KIPO Office action dated Sep. 1, 2012, for Korean Patent application 10-2010-0010136, (5 pages).
KIPO Notice of Allowance dated Sep. 1, 2012, for Korean priority Patent application 10-2010-0013848, (5 pages).
KIPO Notice of Allowance dated Sep. 1, 2012, for Korean Patent application 10-2010-0009160, (5 pages).
Japanese Office action dated Sep. 4, 2012, for correspnding Japanese Patent application 2010-152846, (4 pages).
U.S. Office action dated Aug. 13, 2013, issued to U.S. Appl. No. 13/194,759, (28 pages).
U.S. Office action dated Feb. 26, 2013, issued to U.S. Appl. No. 12/794,093 (31 pages).
U.S. Office action dated Jul. 17, 2013, issued to U.S. Appl. No. 12/984,231, (18 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated May 7, 2013, issued in U.S. Appl. No. 12/820,270 (37 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20 pages).
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Aug. 24, 2012, issued to KR 10-2010-0066993 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, (5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).

(56) References Cited

OTHER PUBLICATIONS

SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 29, 2013, issued to U.S. Appl. No. 12/820,355 (31 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Mar. 17, 2014, for U.S. Appl. No. 12/950,361 (48 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages)_.
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 25, 2013, for U.S. Appl. No. 13/031,756, (34 pages).
U.S. Patent Office Action dated May 16, 2013, issued to U.S. Appl. No. 13/235,337 (28 pages).
US Office action dated Sep. 12, 2012, in U.S. Appl. No. 12/815,673 (26 pages).

\* cited by examiner

THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATIONS

This application claims the benefit of Korean Patent Application No. 10-2009-0078838, filed on Aug. 25, 2009, and Korean Patent Application No. 10-2010-0013848, filed on Feb. 16, 2010, in the Korean Intellectual Property Office, the disclosures of which are incorporated herein by reference.

BACKGROUND

1. Field

Aspects of the present invention relate to a thin film deposition apparatus and a method of manufacturing an organic light-emitting display device by using the same, and more particularly, to a thin film deposition apparatus that can be easily used to manufacture large-sized display devices on a mass scale and that improves manufacturing yield and improves thickness uniformity of deposited thin films, and a method of manufacturing an organic light-emitting display device by using the thin film deposition apparatus.

2. Description of the Related Art

Organic light-emitting display devices have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer and thus emit light. However, it is difficult to achieve high light-emission efficiency with such a structure, and thus intermediate layers, including an electron injection layer, an electron transport layer, a hole transport layer, a hole injection layer, etc., are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5G or more, by using a conventional thin film deposition apparatus. Therefore, it is difficult to manufacture large organic light-emitting display devices having satisfactory driving voltage, current density, brightness, color purity, light-emission efficiency, life-span characteristics. Thus, there is a demand for improvement in this regard.

An organic light-emitting display device includes intermediate layers, including an emission layer disposed between a first electrode and a second electrode that are arranged opposite to each other. The interlayer and the first and second electrodes may be formed using a variety of methods one of which is a deposition method. When an organic light-emitting display device is manufactured using the deposition method, a fine metal mask (FMM) having the same pattern as a thin film to be formed is disposed to closely contact a substrate, and a thin film material is deposited over the FMM in order to form the thin film having the desired pattern.

SUMMARY

Aspects of the present invention provide a thin film deposition apparatus that may be easily manufactured, that may be easily used to manufacture large-sized display devices on a mass scale, that improves manufacturing yield and deposition efficiency, and that allows deposited materials to be reused and improves thickness uniformity of deposited thin films, and a method of manufacturing an organic light-emitting display device by using the thin film deposition apparatus.

According to an aspect of the present invention, there is provided a thin film deposition apparatus for forming a thin film on a substrate, the apparatus including: a deposition source that discharges a deposition material; a deposition source nozzle unit that is disposed at a side of the deposition source and includes a plurality of deposition source nozzles arranged in a first direction; a patterning slit sheet that is disposed opposite to the deposition source and includes a plurality of patterning slits arranged in the first direction; and a barrier plate assembly that is disposed between the deposition source nozzle unit and the patterning slit sheet in the first direction, and includes a plurality of barrier plates that partition a space between the deposition source nozzle unit and the patterning slit sheet into a plurality of sub-deposition spaces, wherein lengths of the patterning slits that correspond to each sub-deposition space are different from one another, and the thin film deposition apparatus is separated from the substrate by a predetermined distance, and the thin film deposition apparatus and the substrate are movable relative to each other.

The farther the patterning slits may be from a center of each sub-deposition space, the greater the lengths of the patterning slits.

Lengths of the patterning slits that correspond to a center of each sub-deposition space may be less than lengths of the patterning slits that correspond to ends of each sub-deposition space.

The apparatus may further include a support member for supporting the patterning slit sheet so as to prevent the patterning slit sheet from sagging toward the deposition source.

The support member may be disposed to cross a lengthwise direction of the patterning slits.

The support member may extend perpendicular to the lengthwise direction of the patterning slits.

According to another aspect of the present invention, the apparatus may further include a correction plate disposed between the deposition source nozzle unit and the patterning slit sheet and blocking at least a portion of the deposition material discharged from the deposition source.

The correction plate may be disposed so that thicknesses of portions of a deposited thin film are substantially the same.

The farther from a center of each sub-deposition space, the less a height of the correction plate.

The correction plate may be arc or cosine curve-shaped.

A height of the correction plate in the centre of each sub-deposition space may be less than a height of the correction plate at ends of each sub-deposition space.

The amount of blocking of the deposition material by the correction plate in the centre of each sub-deposition space may be greater than the amount of blocking of the deposition material by the correction plate at ends of each sub-deposition space.

The correction plate may be disposed between adjacent barrier plates.

The correction plate may be disposed in each sub-deposition space, and a size or shape of the correction plate may be changeable according to a characteristic of the deposition material discharged through the deposition source nozzle disposed in each sub-deposition source.

A size or shape of the correction plate may be changeable so that thicknesses of portions of a thin film deposited in a plurality of sub-deposition spaces are the same.

Each of the barrier walls may extend in a second direction that is substantially perpendicular to the first direction, in order to partition the space between the deposition source nozzle unit and the patterning slit sheet into the plurality of sub-deposition spaces.

The plurality of barrier plates may be arranged at equal intervals.

The barrier walls may be separated from the second nozzle by a predetermined distance.

Each of the barrier plate assemblies may include a first barrier plate assembly including a plurality of first barrier plates, and a second barrier plate assembly including a plurality of second barrier plates.

Each of the first barrier plates and each of the second barrier plates may extend in a second direction that is substantially perpendicular to the first direction, in order to partition the space between the deposition source nozzle unit and the patterning slit sheet into the plurality of sub-deposition spaces.

The first barrier plates may be arranged to respectively correspond to the second barrier plates.

Each pair of the first and second barrier plates corresponding to each other may be arranged on substantially the same plane.

According to another aspect of the present invention, there is provided a thin film deposition apparatus for forming a thin film on a substrate, the apparatus including: a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction perpendicular to the first direction, wherein the plurality of patterning slits are formed to have different lengths from each other, deposition is performed while the substrate or the thin film deposition apparatus is moved relative to each other in the first direction, and the deposition source, the deposition source nozzle unit, and the patterning slit sheet are formed integrally with each other.

According to another aspect of the present invention, there is provided a thin film deposition apparatus for forming a thin film on a substrate, the apparatus including: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits arranged in a second direction perpendicular to the first direction, the patterning slit sheet including a correction plate so as to block at least some of the deposition material discharged from the deposition source, wherein deposition is performed while the substrate or the thin film deposition apparatus is moved relative to each other in the first direction, and the deposition source, the deposition source nozzle unit, and the patterning slit sheet are formed integrally with each other.

According to another aspect of the present invention, there is provided a method of manufacturing an organic light-emitting display device by using a thin film deposition apparatus for forming a thin film on a substrate, the method including: arranging the substrate to be separated from the thin film deposition apparatus by a predetermined distance; and depositing a deposition material discharged from the thin film deposition apparatus onto the substrate while the thin film deposition apparatus or the substrate is moved relative to each other.

The depositing of the deposition material on the substrate may further include continuously depositing the deposition material discharged from the thin film deposition apparatus on the substrate while the substrate or the thin film deposition apparatus is moved relative to each other.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
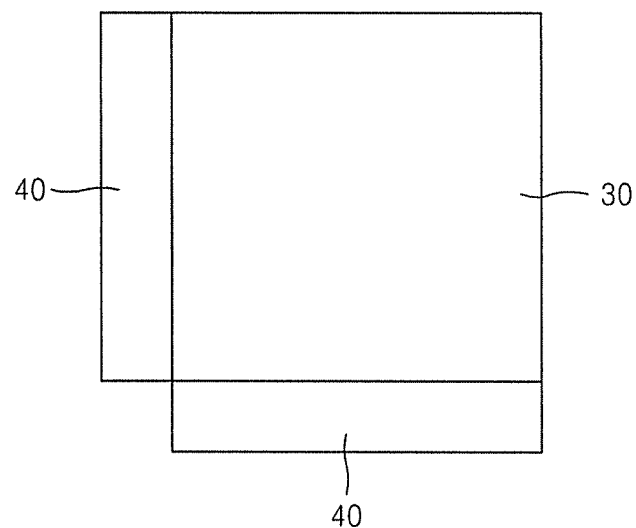
FIG. 1 is a plan view of an organic light-emitting display device manufactured by using a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

FIG. 1 is a plan view of an organic light-emitting display device manufactured by using a thin film deposition apparatus, according to an embodiment of the present invention.

Referring to FIG. 1, the organic light-emitting display device according to an embodiment includes a pixel region 30 and circuit regions 40 disposed at edges of the pixel region 30. The pixel region 30 includes a plurality of pixels, and each of the pixels includes an emission unit that emits light to display an image.

In an embodiment of the present invention, the emission unit may include a plurality of sub-pixels, each of which includes an organic light emitting device. In a full-color organic light-emitting display device, red (R), green (G) and blue (B) sub-pixels are arranged in various patterns, for example, in a line, mosaic, or lattice pattern, to constitute a pixel. However, the organic light-emitting display device may be a monochromatic flat display device, and not a full-color flat display device. The circuit regions 40 control, for example, an image signal that is input to the pixel region 30. In the organic light-emitting display device according to the present embodiment, at least one thin film transistor (TFT) may be installed in each of the pixel region 30 and the circuit region 40.

The at least one TFT installed in the pixel region 30 may include a pixel TFT, such as a switching TFT that transmits a data signal to an organic light emitting device according to a gate line signal to control the operation of the organic light emitting device, and a driving TFT that drives the organic light emitting device by supplying current according to the data signal. The at least one TFT installed in the circuit region 40 may include a circuit TFT constituted to implement a predetermined circuit.

The number and arrangement of TFTs may vary according to the features of the display device and the driving method thereof.

Figure 2:
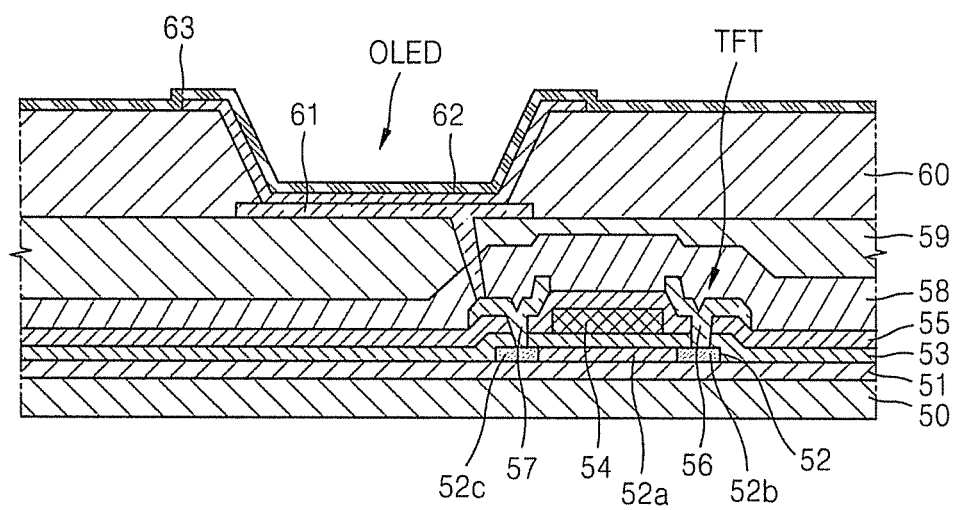
FIG. 2 is a sectional view of a sub-pixel of the organic light-emitting display device illustrated in FIG. 1, according to an embodiment of the present invention.

FIG. 2 is a sectional view of a sub-pixel of the organic light-emitting display device illustrated in FIG. 1, according to an embodiment of the present invention.

Referring to FIG. 2, a buffer layer 51 is formed on a substrate 50 formed of glass or plastic. A TFT and an organic light emitting device are formed on the buffer layer 51.

An active layer 52 having a predetermined pattern is formed on the buffer layer 51 of the substrate 50. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52$b$ and 52$c$, respectively, of the active layer 52 through contact holes. A gate region 52$c$ is disposed between the source/drain regions 52$b$ and 52$c$. A passivation layer 58 is formed of $SiO_2$, $SiN_x$, etc. on the source/drain electrodes 56 and 57. A planarization layer 59 is formed of an organic material, such as acryl, polyimide, benzocyclobutene (BCB), etc., on the passivation layer 58. A pixel electrode 61, which functions as an anode of the organic light emitting device, is formed on the planarization layer 59, and a pixel defining layer 60 formed of an organic material is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. Aspects of the present invention are not limited to the structure of the organic light-emitting display device described above, and various structures of organic light-emitting display devices may be applied to the present invention.

The organic light emitting device displays predetermined image information by emitting red, green and blue light as current flows. The organic light emitting device includes the pixel electrode 61, which is connected to the drain electrode 57 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), etc. The low-molecular weight organic layer may be formed by vacuum deposition.

When a high-molecular weight organic layer is used as the organic layer 62, the organic layer 62 may mostly have a structure including an HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 including the emission layer may be formed by using a thin film deposition apparatus 100 (see FIG. 3), which will be described later.

Hereinafter, a thin film deposition apparatus according to an embodiment of the present invention and a method of manufacturing an organic light-emitting display device by using the thin film deposition apparatus will be described in detail.

Figure 3:
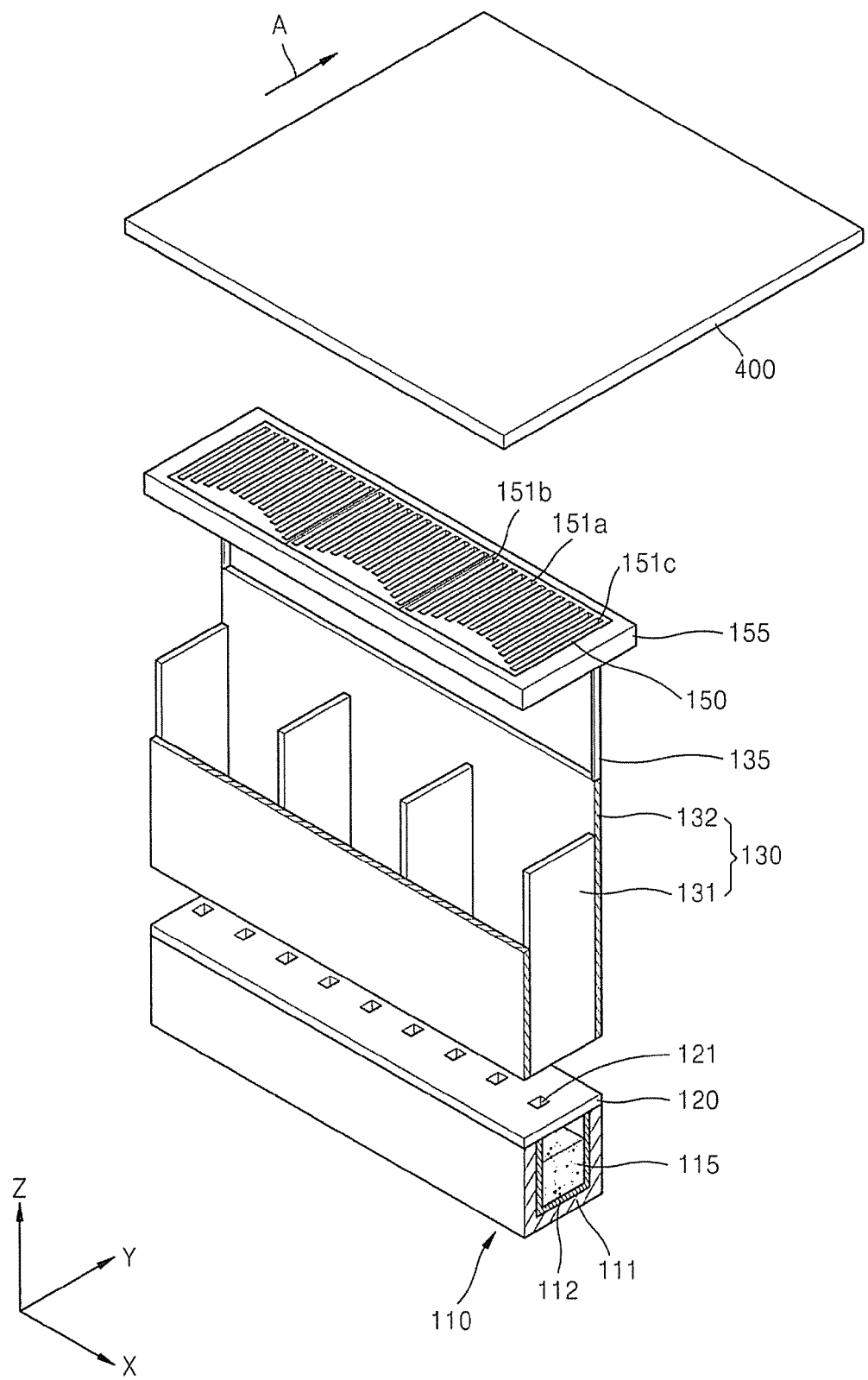
FIG. 3 is a schematic perspective view of a thin film deposition apparatus according to an embodiment of the present invention.
Figure 4:
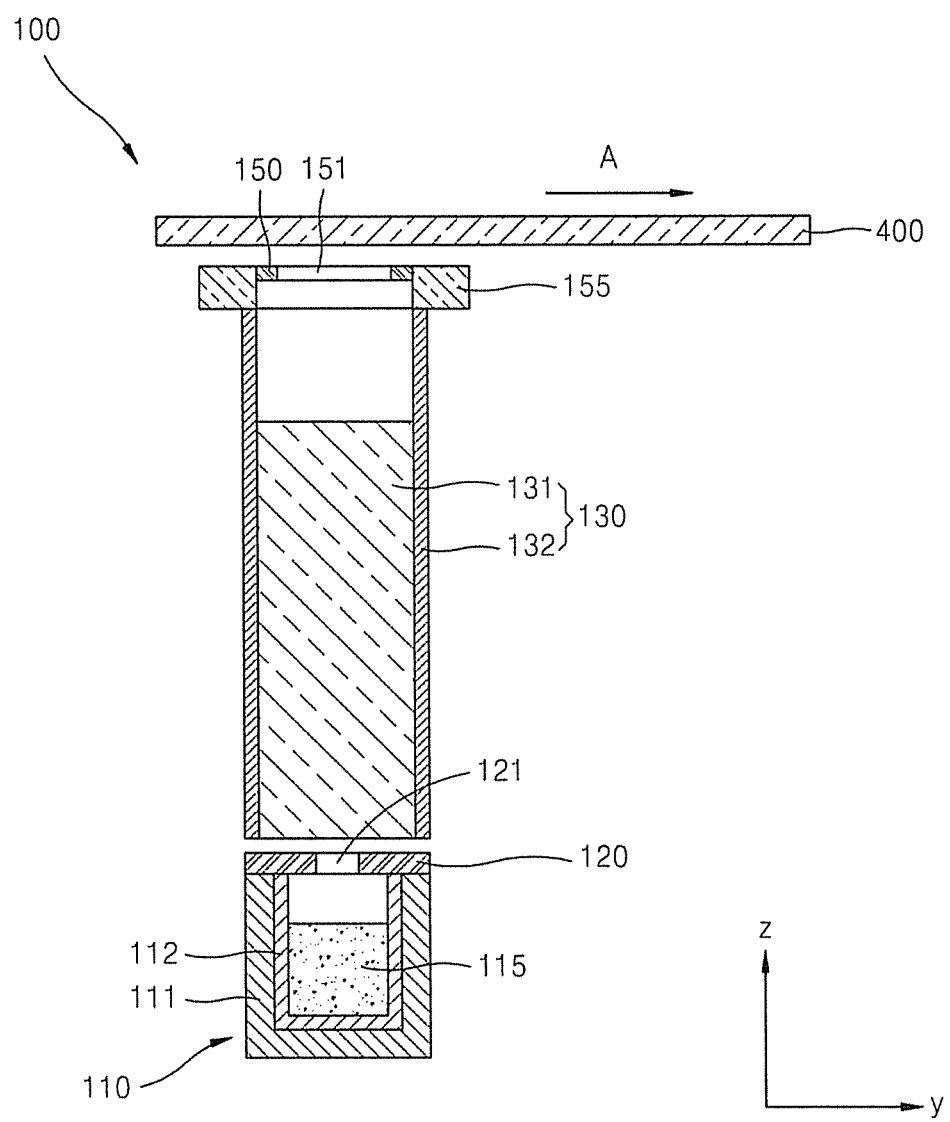
FIG. 4 is a schematic sectional view of the thin film deposition apparatus illustrated in FIG. 3, according to an embodiment of the present invention.
Figure 5:
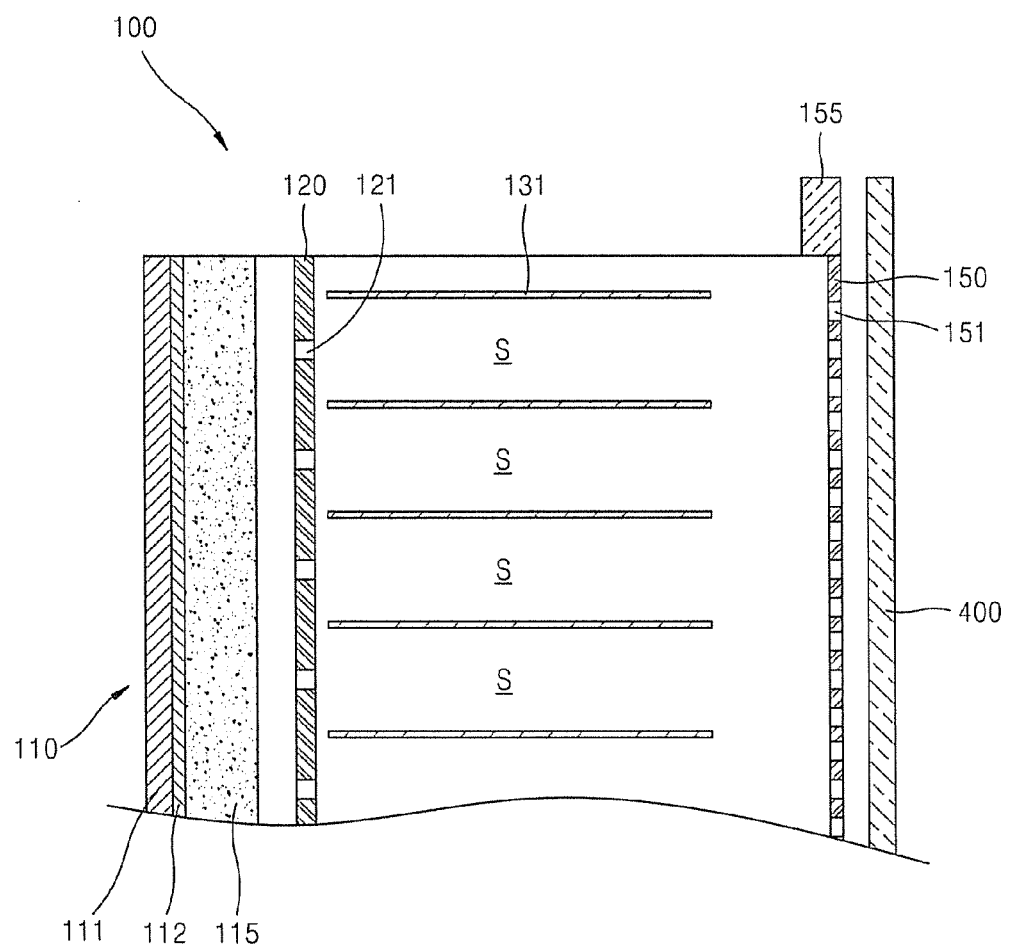
FIG. 5 is a schematic plan view of the thin film deposition apparatus illustrated in FIG. 3, according to an embodiment of the present invention.
Figure 5:
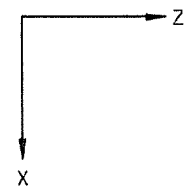

FIG. 3 is a schematic perspective view of a thin film deposition apparatus 100 according to an embodiment of the present invention, FIG. 4 is a schematic sectional view of the thin film deposition apparatus 100 illustrated in FIG. 3, and FIG. 5 is a schematic plan view of the thin film deposition apparatus 100 illustrated in FIG. 3.

Referring to FIGS. 3, 4 and 5, the thin film deposition apparatus 100 includes a deposition source 110, a deposition source nozzle unit 120, a barrier plate assembly 130, and a patterning slit sheet 150.

Although a chamber is not illustrated in FIGS. 3, 4 and 5 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

In particular, in order to deposit a deposition material 115 that is emitted from the deposition source 110 and is discharged through the deposition source nozzle unit 120 and the patterning slit sheet 150, onto a substrate 400 in a desired pattern, the chamber should be maintained in a high-vacuum state as in a deposition method using a fine metal mask (FMM). In addition, the temperatures of barrier plates 131 and the patterning slit sheet 150 should be sufficiently lower than the temperature of the deposition source 110. Therefore, the temperatures of the barrier plates 131 and the patterning slit sheet 150 may be about 100° C. or less. This is so the deposition material 115 that has collided against the barrier plates 131 does not re-vaporize. In addition, thermal expansion of the patterning slit sheet 150 may be minimized when the temperature of the patterning slit sheet 150 is sufficiently lower than the temperature of the deposition source 110. The barrier plate assembly 130 faces the deposition source 110 which is at a high temperature. In addition, the temperature of a portion of the barrier plate assembly 130 closest to the deposition source 110 rises by a maximum of about 167° C., and thus a partial-cooling apparatus may be further included if needed. Therefore, the barrier plate assembly 130 may include a cooling member (not shown).

The substrate 400, which constitutes a target on which a deposition material 115 is to be deposited, is disposed in the chamber. The substrate 400 may be a substrate for flat panel displays. A large substrate, such as a mother glass, for manufacturing a plurality of flat panel displays, may be used as the substrate 400. Other substrates may also be employed.

Deposition may be performed while the substrate 400 or the thin film deposition apparatus 100 is moved relative to each other.

In particular, in the conventional FMM deposition method, the size of the FMM has to be equal to the size of a substrate. Thus, the size of the FMM has to be increased as the substrate becomes larger. However, it is neither straightforward to manufacture a large-sized FMM nor to extend an FMM to be accurately aligned with a pattern.

In order to overcome this problem, in the thin film deposition apparatus 100 according to an embodiment of the present invention, deposition may be performed while the thin film deposition apparatus 100 or the substrate 400 is moved relative to each other. In other words, deposition may be continuously performed while the substrate 400, which is disposed such as to face the thin film deposition apparatus 100, is moved in a Y-axis direction. That is, deposition is performed in a scanning manner. Although the substrate 400 is illustrated as being moved in the Y-axis direction within a chamber (not shown) in FIG. 3 when deposition is performed, aspects of the present invention are not limited thereto. Deposition may be performed while the thin film deposition apparatus 100 is moved in the Y-axis direction, whereas the substrate 400 is fixed.

Thus, in the thin film deposition apparatus 100, the patterning slit sheet 150 may be significantly smaller than an FMM used in a conventional deposition method. In other words, in the thin film deposition apparatus 100, deposition is continuously performed, i.e., in a scanning manner while the substrate 400 is moved in the Y-axis direction. Thus, when a width of the patterning slit sheet 150 in the X-axis direction and a width of the substrate 400 in the X-axis direction are substantially the same, a length of the patterning slit sheet 150 in the Y-axis direction may be significantly less than a length of the substrate 400 in the Y-axis direction. As described above, since the patterning slit sheet 150 may be formed to be significantly smaller than an FMM used in a conventional deposition method, it is relatively easy to manufacture the patterning slit sheet 150. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition apparatus 100 or the substrate 400 is moved relative to each other as described above, the thin film deposition apparatus 100 and the substrate 400 may be separated from each other by a predetermined distance. This will be described later in detail.

The deposition source 110 that contains and heats the deposition material 115 is disposed in an opposite side of the chamber to the side in which the substrate 400 is disposed. As the deposition material 115 contained in the deposition source 110 is vaporized, the deposition material 115 is deposited on the substrate 400.

In particular, the deposition source 110 includes a crucible 111 that is filled with the deposition material 115, and a heater 112 that heats the crucible 111 to vaporize the deposition material 115, which is contained in the crucible 111, towards a side of the crucible 111, and in particular, towards the deposition source nozzle unit 120.

The deposition source nozzle unit 120 is disposed at a side of the deposition source 110, and in particular, at the side of the deposition source 110 facing the substrate 400. The deposition source nozzle unit 120 includes a plurality of deposition source nozzles 121 arranged in the X-axis direction. The deposition material 115 that is vaporized in the deposition source 110, passes through the deposition source nozzle unit 120 towards the substrate 400.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to an YZ plane in FIG. 3, i.e., perpendicular to the X-axis direction.

The plurality of barrier plates 131 arranged as described above partition the space between the deposition source nozzle unit 120 and the patterning slit sheet 150 into a plurality of sub-deposition spaces S (see FIG. 5). In the thin film deposition apparatus 100, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131, but the aspects of the invention are not limited thereto and more than one deposition source nozzle 121 may be disposed between two adjacent barrier plates 131. The deposition source nozzles 121 may be respectively located at the midpoint between two adjacent barrier plates 131. As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 so as to be deposited on the substrate 400. In other words, the barrier plates 131 guide the deposition material 115, which is discharged through the deposition source nozzles 121, to move substantially straight in the Z-axis direction, and not to flow in the X-axis direction.

As described above, the deposition material 115 is forced to move straight by installing the barrier plates 131, so that a smaller shadow zone may be formed on the substrate 400 compared to a case where no barrier plates are installed. Thus, the thin film deposition apparatus 100 and the substrate 400 can be separated from each other by a predetermined distance. This will be described later in detail.

The barrier plate frame 132, which forms upper and lower sides of the barrier plates 131, maintains the positions of the barrier plates 131, and guides the deposition material 115 to move substantially in the Z-axis direction, which is discharged through the deposition source nozzles 121, and not to flow in the Y-axis direction.

Although the deposition source nozzle unit 120 and the barrier plate assembly 130 are illustrated as being separated from each other by a predetermined distance, aspects of the present invention are not limited thereto, and the deposition source nozzle unit 120 may be disposed on the barrier plate assembly 130. In order to prevent the heat emitted from the deposition source 110 from being conducted to the barrier plate assembly 130, the deposition source nozzle unit 120 and the barrier plate assembly 130 may be separated from each other by a predetermined distance. Alternatively, if a heat insulator is disposed between the deposition source nozzle unit 120 and the barrier plate assembly 130, the deposition source nozzle unit 120 and the barrier plate assembly 130 may be bound together with the heat insulator therebetween.

In addition, the barrier plate assembly 130 may be constructed to be detachable from the thin film deposition apparatus 100. A conventional FMM deposition method has low deposition efficiency. Here, deposition efficiency is the ratio of the deposition material 115 deposited on the substrate 400 to the deposition material 115 vaporized in the deposition source 110. Furthermore, in the conventional FMM deposition method, about 68% of organic deposition material, which has not been deposited on the substrate, remains adhered to a deposition apparatus, and thus it is not easy to reuse the deposition material.

In order to overcome these problems, in the thin film deposition apparatus 100 according to an embodiment of the present invention, the deposition space is enclosed by using the barrier plate assembly 130, so that the deposition material 115 that is not deposited on the substrate 400 is mostly deposited within the barrier plate assembly 130. Thus, since the barrier plate assembly 130 is constructed to be detachable from the thin film deposition apparatus 100, when a large amount of the deposition material 115 lies in the barrier plate assembly 130 after a long deposition process, the barrier plate assembly 130 may be detached from the thin film deposition apparatus 100 and then placed in a separate deposition material recycling apparatus in order to recover the deposition material 115. Due to the structure of the thin film deposition apparatus 100, a reuse rate of the deposition material 115 is increased, so that the deposition efficiency is improved, and thus the manufacturing costs are reduced.

The patterning slit sheet 150 and a frame 155 in which the patterning slit sheet 150 is bound may be disposed between the deposition source 110 and the substrate 400. The frame 155 may be formed in a lattice shape, similar to a window frame. The patterning slit sheet 150 is bound inside the frame 155. The patterning slit sheet 150 includes a plurality of patterning slits 151 arranged in the X-axis direction. Lengths of the patterning slits 151 formed in each sub-deposition space S may not be the same, as illustrated in FIG. 3. This is to improve thickness uniformity of deposited thin films. This will be described in detail later.

The deposition material 115 that is vaporized in the deposition source 110, passes through the deposition source nozzle unit 120 and the patterning slit sheet 150 towards the substrate 400. The patterning slit sheet 150 may be manufactured by etching, which is the same method as used in a conventional method of manufacturing an FMM, and in particular, a striped FMM.

In the thin film deposition apparatus 100 according to an embodiment of the present invention, the total number of patterning slits 151 may be greater than the total number of deposition source nozzles 121. In addition, there may be a greater number of patterning slits 151 than deposition source nozzles 121 disposed between two adjacent barrier plates 131.

In other words, at least one deposition source nozzle 121 may be disposed between each two adjacent barrier plates 131. Meanwhile, a plurality of patterning slits 151 may be disposed between each two adjacent barrier plates 131. The space between the deposition source nozzle unit 120 and the patterning slit sheet 150 is partitioned by the barrier plates 131 into sub-deposition spaces S that correspond to the deposition source nozzles 121, respectively. Thus, the deposition material 115 discharged from each of the deposition source nozzles 121 passes through a plurality of patterning slits 151 disposed in the sub-deposition space S corresponding to the deposition source nozzle 121, and is then deposited on the substrate 400.

In addition, the barrier plate assembly 130 and the patterning slit sheet 150 may be formed to be separated from each other by a predetermined distance. Alternatively, the barrier plate assembly 130 and the patterning slit sheet 150 may be connected by a connection member 135. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other by a predetermined distance.

As described above, the thin film deposition apparatus 100 performs deposition while being moved relative to the substrate 400. In order to move the thin film deposition apparatus 100 relative to the substrate 400, the patterning slit sheet 150 is separated from the substrate 400 by a predetermined distance. In addition, in order to prevent the formation of a relatively large shadow zone on the substrate 400 when the patterning slit sheet 150 and the substrate 400 are separated from each other, the barrier plates 131 are arranged between the deposition source nozzle unit 120 and the patterning slit sheet 150 to force the deposition material 115 to move in a substantially straight line through the thin film deposition apparatus 100. Thus, the size of the shadow zone formed on the substrate 400 is sharply reduced.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 100 according to an embodiment of the present invention, the patterning slit sheet 150 is disposed to be separated from the substrate 400 by a predetermined distance. This may be facilitated by installing the barrier plates 131 to reduce the size of the shadow zone formed on the substrate 400.

As described above, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. Furthermore, since it is unnecessary to use the FMM in close contact with the substrate during a deposition process, the manufacturing speed may be improved.

Hereinafter, the size of a shadow zone formed on a substrate when barrier plates are installed and the size of a shadow zone formed on a substrate when no barrier plates are installed are compared.

Figure 6A:
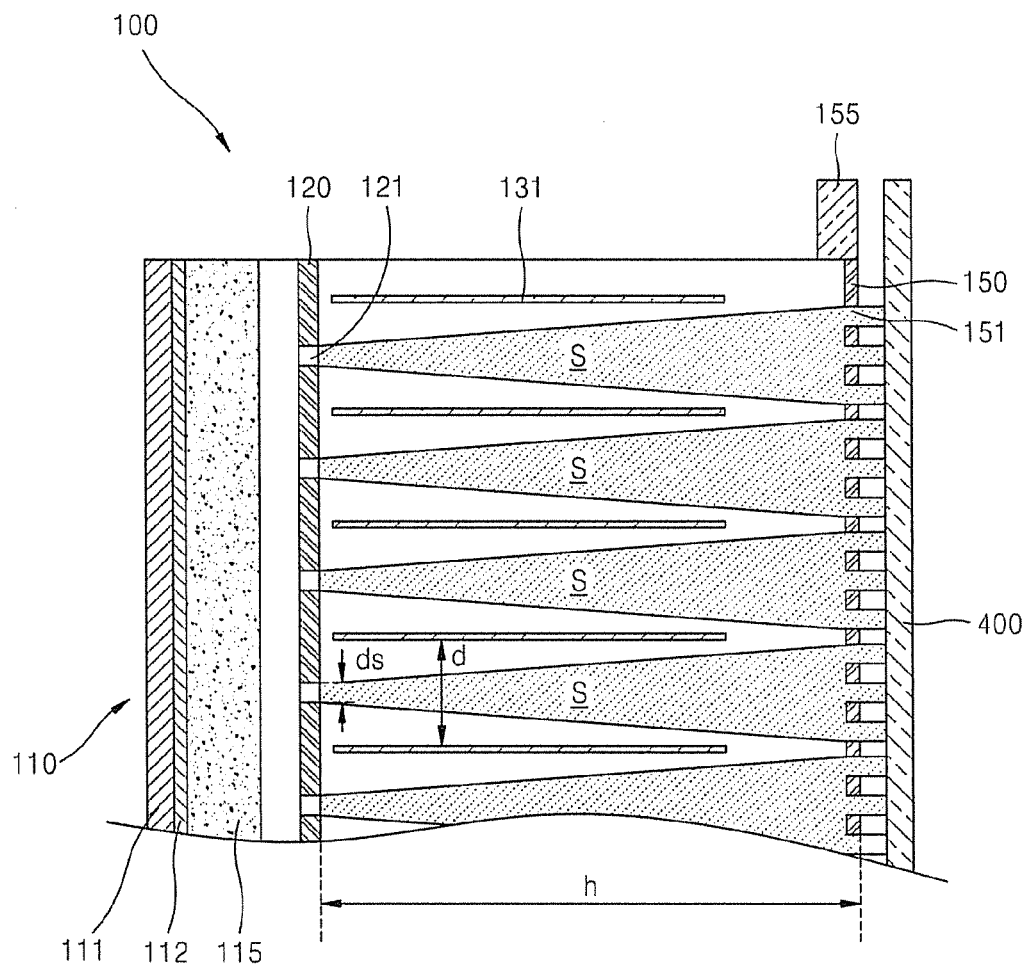
FIG. 6A is a schematic view for describing deposition of a deposition material in the thin film deposition apparatus of FIG. 3, according to an embodiment of the present invention.
Figure 6B:
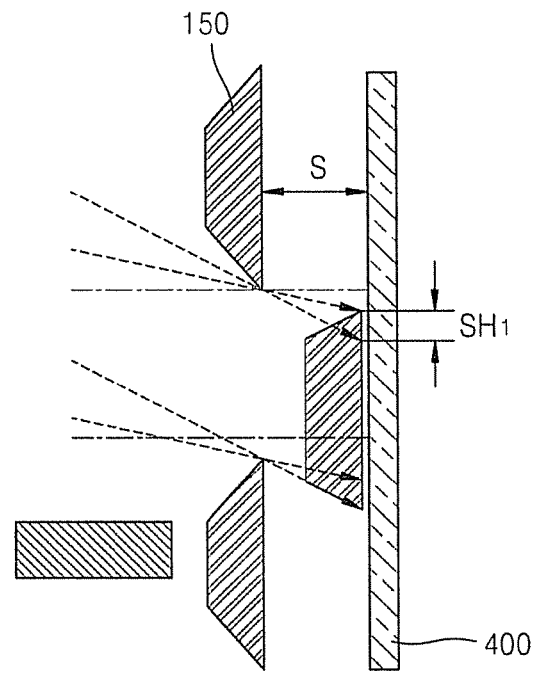
FIG. 6B illustrates a shadow zone of a thin film deposited on a substrate when a deposition space is partitioned by barrier plates, as illustrated in FIG. 6A, according to an embodiment of the present invention.
Figure 6C:
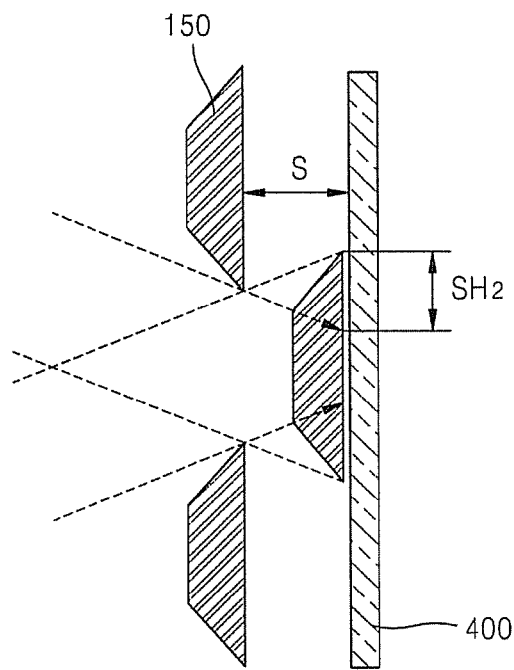
FIG. 6C illustrates a shadow zone of a thin film deposited on the substrate when the deposition space is not partitioned.

FIG. 6A is a schematic view for describing deposition of the deposition material 115 in the thin film deposition apparatus 100, according to an embodiment of the present invention. FIG. 6B illustrates a shadow zone of a thin film deposited on the substrate 400 when the deposition space is partitioned by the barrier plates 131. FIG. 6C illustrates a shadow zone of a thin film deposited on the substrate 400 when the deposition space is not partitioned by the barrier plates 131.

Referring to FIG. 6A, the deposition material 115 that is vaporized in the deposition source 110 is deposited on the substrate 400 by being discharged through the deposition source nozzle unit 120 and the patterning slit sheet 150. Since the space between the deposition source nozzle unit 120 and the patterning slit sheet 150 is partitioned into a plurality of sub-deposition spaces S by the barrier plates 131, the deposition material 115 discharged through each of the deposition source nozzles 121 is not mixed with the deposition material 115 discharged through the other adjacent deposition source nozzles 121 due to the barrier plates 131.

When the space between the deposition source nozzle unit 120 and the patterning slit sheet 150 is partitioned by the barrier plate assembly 130, as illustrated in FIGS. 6A and 6B, a width $SH_1$ of a shadow zone formed on the substrate 400 may be determined using Equation 1 below.

$$SH_1 = s \cdot d_s/h \quad \text{[Equation 1]}$$

where s denotes a distance between the patterning slit sheet 150 and the substrate 400, $d_s$ denotes a width of each of the deposition source nozzles 121, and h denotes a distance between the deposition source 110 and the patterning slit sheet 150.

However, when the space between the deposition source nozzle unit 120 and the patterning slit sheet 150 is not partitioned by the barrier plates 131, as illustrated in FIG. 6C, the deposition material 115 is discharged through the patterning slit sheet 150 in a wider range of angles than in the case of FIG. 6B. This is because the deposition material 115 discharged not just through a deposition source nozzle 121 directly facing a patterning slit 151 but also through deposition source nozzles 121 other than the deposition source nozzle 121 above, passes through the patterning slit 151 above and is then deposited on the substrate 400. Thus, a width $SH_2$ of a shadow zone formed on the substrate 400 is much greater than when the deposition space is partitioned by the barrier plates 131. The width $SH_2$ of the shadow zone formed on the substrate 400 is determined using Equation 2.

$$SH_2 = s \cdot 2d/h \quad \text{[Equation 2]}$$

where s denotes a distance between the patterning slit sheet 150 and the substrate 400, d denotes an interval between adjacent barrier plates 131, and h denotes a distance between the deposition source 110 and the patterning slit sheet 150.

Referring to Equations 1 and 2, $d_s$, which is the width of each of the deposition source nozzles 121, is a few to tens times less than d, which is the interval between the adjacent barrier plates 131, and thus the shadow zone may have a smaller width when the space between the deposition source nozzle unit 120 and the patterning slit sheet 150 is partitioned by the barrier plates 131. The width $SH_2$ of the shadow zone formed on the substrate 400 may be reduced by either one of the following: (1) by reducing the interval d between the adjacent barrier plates 131, (2) by reducing the distance s between the patterning slit sheet 150 and the substrate 400, or (3) by increasing the distance h between the deposition source 110 and the patterning slit sheet 150.

As described above, the shadow zone formed on the substrate 400 may be reduced by installing the barrier plates 131. Thus, the patterning slit sheet 150 can be separated from the substrate 400.

Hereinafter, a patterning slit sheet for obtaining thickness uniformity of a thin film deposited on an entire surface of the substrate 400 will be described in detail.

Figure 7:
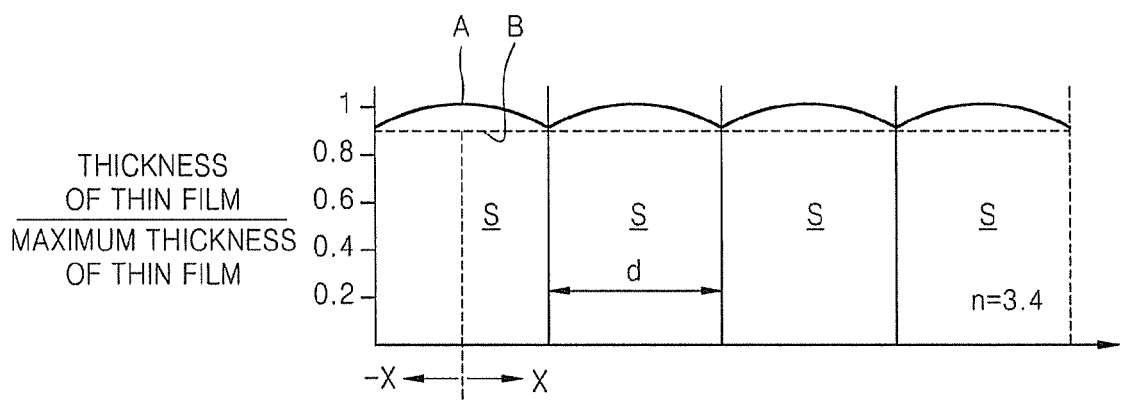
FIG. 7 is a schematic view illustrating distribution of portions of a thin film deposited on a substrate by using the thin film deposition apparatus of FIG. 3, according to an embodiment of the present invention.

FIG. 7 is a schematic view illustrating distribution of portions of a thin film deposited on a substrate by using a conventional thin film deposition apparatus and the thin film deposition apparatus 100 according to an embodiment of the present invention. FIG. 7 illustrates a case where the amount or coefficient of radiation of the deposition material 115 discharged through each opening, i.e., each of the deposition source nozzles 121 of FIG. 3, is the same. In FIG. 7, S denotes each sub-deposition space, and d denotes a distance between adjacent barrier plates 131.

In FIG. 7, the shape of portions of the thin film deposited by the conventional thin film deposition apparatus including a patterning slit sheet having patterning slits of the same lengths is indicated by a line A, and the shape of portions of the thin film deposited by the thin film deposition apparatus 100 including the patterning slit sheet 150 having the patterning slits 151 of different lengths is indicated by a line B.

Referring to FIG. 7, the greatest amount of a deposition material 115 in a vacuum state is discharged in a portion that is perpendicular to each of the deposition source nozzles (see 121 of FIG. 3) according to the cosine law, i.e., in a central portion of each sub-deposition space S, and the amount of the deposition material 115 discharged is decreased in a portion close to the barrier plates (see 131 of FIG. 3). Thus, a thin film deposited by the conventional thin film deposition apparatus including patterning slit sheets having patterning slits of the same lengths may be formed in the shape of the line A of FIG. 7. That is, in the sub-deposition spaces S, the central portion of the film is convex. As for the entire surface of the thin film formed on the substrate 400, the thin film has an irregular surface formed of repeating convex portions and concave portions.

In this case, the relationship between a distance between central portions of each sub-deposition space S and thicknesses of portions of the deposited thin film may be easily derived from experiments. In most cases, the relationship may be expressed as a function of $\cos^n(\theta)$.

In order to eliminate non-uniformity of thicknesses of portions of the deposited thin film in each sub-deposition space S described above, lengths of the patterning slits 151 may be different from each other.

Figure 8:
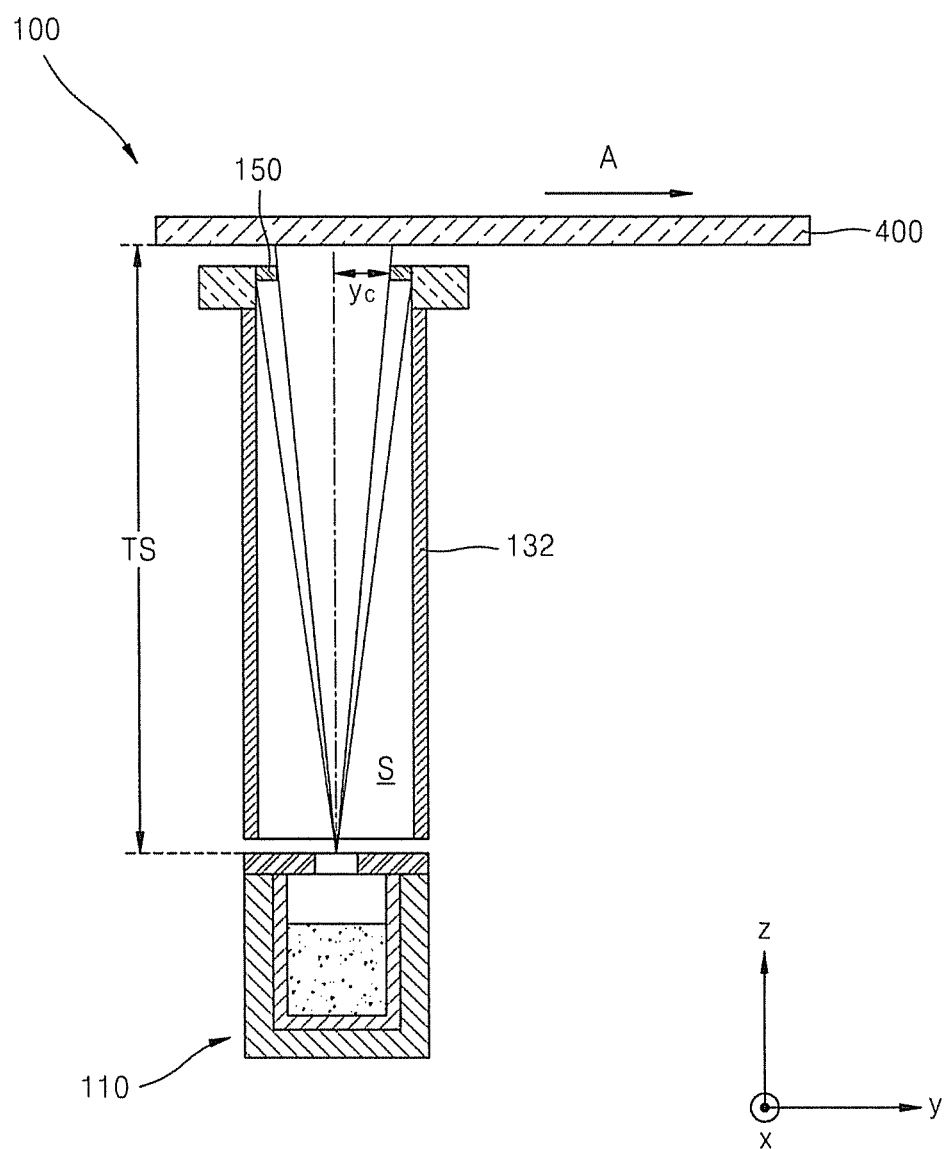
FIG. 8 is a schematic view illustrating a deposition material discharged from a deposition source of the thin film deposition apparatus of FIG. 3, according to an embodiment of the present invention.

FIG. 8 is a schematic view illustrating a deposition material 115 discharged from a deposition source of the thin film deposition apparatus 100 of FIG. 3, according to an embodiment of the present invention.

A profile of a deposited thin film may be determined by a distance between the deposition source 110 and the substrate 400 and by n of $\cos^n(\theta)$. The thin film deposition apparatus 100 of FIG. 3 performs deposition while moving relative to the substrate 400, and thus deposition materials are overlapped with each other along a moving direction of the thin film deposition apparatus 100 of FIG. 3. The thicknesses of portions of the deposited thin film according to positions may be determined using Equation 3 below:

$$\int_0^{y_c} \left( \frac{TS}{\sqrt{(TS)^2 + x_c^2 + y^2}} \right)^n dy = \int_0^{y_c} \left( \frac{TS}{\sqrt{(TS)^2 + x_e^2 + y^2}} \right)^n dy \quad \text{[Equation 3]}$$

where TS denotes a distance between the deposition source 110 and the substrate 400, $x_c$ denotes the central position of the substrate 400 that only corresponds to one or a few sub-deposition spaces S, $x_e$ is an arbitrary position of the substrate 400 that only corresponds to one or a few sub-deposition spaces S, and y is the length of each of the patterning silts 151.

The left side of Equation 3 denotes the thickness of a portion of a deposited thin film in the central position of the substrate 400 and corresponds to only one or a few sub-deposition spaces S, and the right side of Equation 3 denotes the thickness of a portion of the deposited thin film in an arbitrary position of the substrate 400 and corresponds to only one or a few sub-deposition spaces S. Thus, when the left and right sides of Equations 3 are the same, the thicknesses of portions of the deposited thin film may be uniform. In order to obtain the length of each of the patterning slits 151 in which the thicknesses of portions of the deposited thin film are uniform, Equation 3 may be obtained as a polynomial of x with respect to y as shown in Equation 4 below, $$y = \sum_{i=0}^{4} a_i x^i \qquad \text{[Equation 4]}$$

Equation 4 is expressed with four variable coefficients, in which a higher order term is 4, but aspects of the present invention are not limited thereto and Equation 4 may be expressed with five variable coefficients, in which a higher order term is 5.

Figure 9:
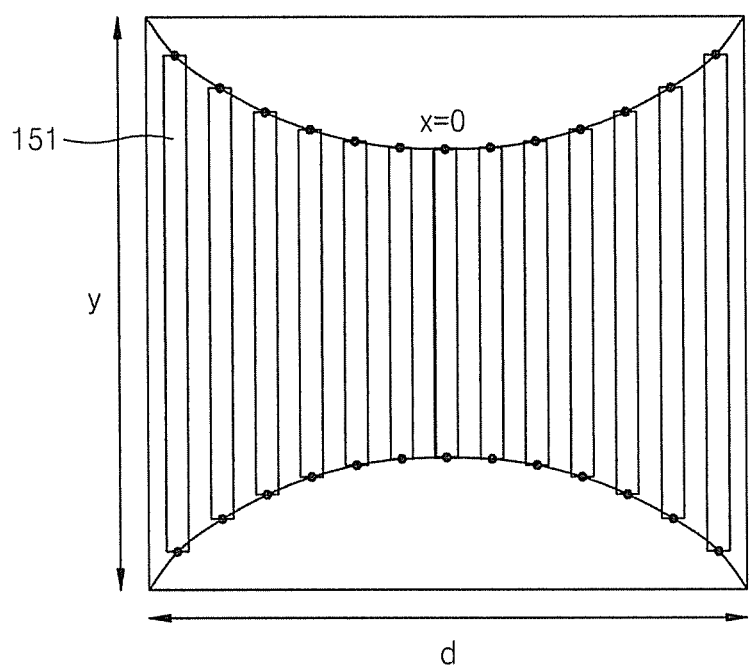
FIG. 9 is a view of a portion of a patterning slit sheet.

FIG. 9 is a view of a portion of a patterning slit sheet according to Equations 3 and 4. More specifically, FIG. 9 illustrates a portion of a patterning slit sheet that corresponds to each sub-deposition space formed by adjacent barrier walls. Referring to FIG. 9, lengths of patterning slits 151 of the patterning slit sheet are different from each other, and the farther the patterning slits 151 are from a central portion (x=0) of each sub-deposition space S and the closer the patterning slits 151 are to a periphery portion of each sub-deposition space S, the greater a length y of each of the patterning slits 151.

Figure 10:
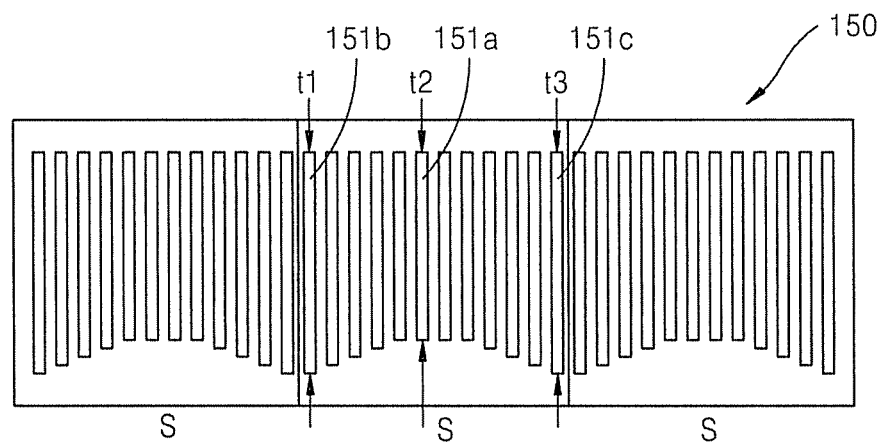
FIG. 10 is a plan view of a patterning slit sheet of the thin film deposition apparatus of FIG. 3, according to an embodiment of the present invention.

FIG. 10 is a plan view of the patterning slit sheet 150 of the thin film deposition apparatus of FIG. 3, according to an embodiment of the present invention. Referring to FIG. 10, the farther patterning slits 151a, 151b, and 151c from a centre of each sub-deposition space S, the greater the lengths of the patterning slits 151a, 151b, and 151c. In other words, a length t2 of the patterning slit 151a that corresponds to a centre of each sub-deposition space S is the smallest from among patterning slits that correspond to each sub-deposition space S. Also, the farther a patterning slit from the patterning slit 151a, the greater the length of the patterning slit. Thus, the length t2 of the patterning slit 151a that corresponds to a centre of each sub-deposition space S is the smallest, and lengths t1 and t3 of the respective patterning slits 151b and 151c that correspond to both ends of each sub-deposition space S are the longest. The patterning slits 151a, 151b, and 151c having the above shapes may be repeatedly arranged in the patterning slit sheet 150.

The patterning slits described above may block a portion of the deposition material 115 that is incident on the patterning slit sheet 150 from a deposition source nozzle (see 121 of FIG. 3). Specifically, each portion of the thin film deposited by the thin film deposition apparatus 100 of FIG. 3 has a central portion having a convex shape, and thus, in order to make the thicknesses of portions of the deposited thin film uniform, some deposition material 115 toward the central portion of each sub-deposition space S needs to be blocked. Thus, lengths of the patterning slits 151a, 151b, and 151c are different from one another so that some deposition material 115 may be blocked. In this case, the patterning slit sheet 150 is formed in such a way that lengths of the patterning slits 151a, 151b, and 151c may be increased closer to both ends of each sub-deposition space S. Thus, a small amount of deposition material 115 is discharged through the patterning slit 151a that corresponds to the central portion of each sub-deposition space S in which the length of the patterning slit 151a is relatively small, and a large amount of deposition material 115 is discharged through the patterning slits 151b and 151c that correspond to ends of each sub-deposition space S in which the lengths of the patterning slits 151b and 151c are relatively large. In this case, the lengths of the patterning slits 151a, 151b, and 151c may be different from one another so that a portion of each sub-deposition space S in which the thickness of a portion of the deposited thin film is the smallest, generally, the thickness of a portion of the thin film deposited at both ends of each sub-deposition space S, may be the overall thin film thickness.

In this manner, the lengths of the patterning slits 151a, 151b, and 151c may be different from one another so that a thin film deposited by the thin film deposition apparatus 100 of FIG. 3 may be corrected in the form of the line B of FIG. 7. In other words, the amount of deposition may be corrected in such a way that the length of a patterning slit may be relatively small in a portion in which a relatively large amount of deposition material 115 is deposited, so that a small amount of deposition material 115 is discharged through the patterning slit that corresponds to the portion, and the length of a patterning slit may be relatively large in a portion in which a small amount of deposition material 115 is deposited, so that the overall film thickness may be uniform.

The thickness uniformity of a thin film deposited on a substrate according to an embodiment of the present invention has an error range of 1% to 2%, and thus the quality and reliability of a structure including the substrate on which the thin film is formed may be improved.

Figure 11:
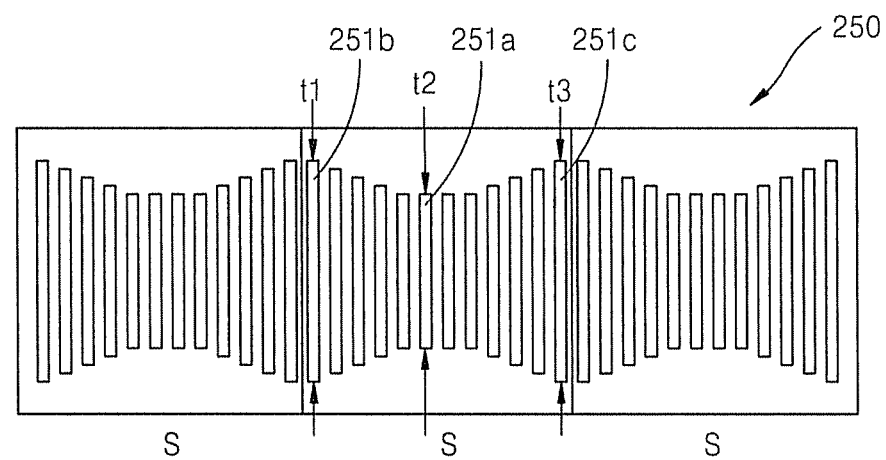
FIG. 11 is a plan view of a patterning slit sheet of the thin film deposition apparatus of FIG. 3, according to another embodiment of the present invention.

FIG. 11 is a plan view of a patterning slit sheet 250 of the thin film deposition apparatus of FIG. 3, according to another embodiment of the present invention. Referring to FIG. 11, the patterning slit sheet 250 includes patterning slits having different lengths. The patterning slit sheet 250 of FIG. 11 is similar to the patterning slit sheet 150 of FIG. 10 in that the patterning slit sheet 250 of FIG. 11 includes patterning slits having different lengths. However, in the patterning slit sheet 150 of FIG. 10, upper ends of the patterning slits 151a, 151b, and 151c are located in the same position, and lower ends thereof are located in different positions. However, in the patterning slit sheet 250 of FIG. 11, both upper and lower ends of patterning slits 251a, 251b and 251c are located in different positions. The patterning slit sheet 250 of FIG. 11 is similar to the patterning slit sheet 150 of FIG. 10 in that, in spite of a difference between positions of the patterning slits, lengths of the patterning slits 251a, 251b, and 251c of the patterning slit sheet 250 of FIG. 11 are increased closer to both ends of each sub-deposition space S. Thus, a small amount of deposition material is discharged through the patterning slit 251a that corresponds to the central portion of each sub-deposition space S in which the length of the patterning slit 251a is relatively small, and a large amount of deposition material is discharged through the patterning slits 251b and 251c that correspond to ends of each sub-deposition space S in which the lengths of the patterning slits 251b and 251c are relatively large, so that the thicknesses of portions of a deposited thin film may be uniform.

Figure 12:
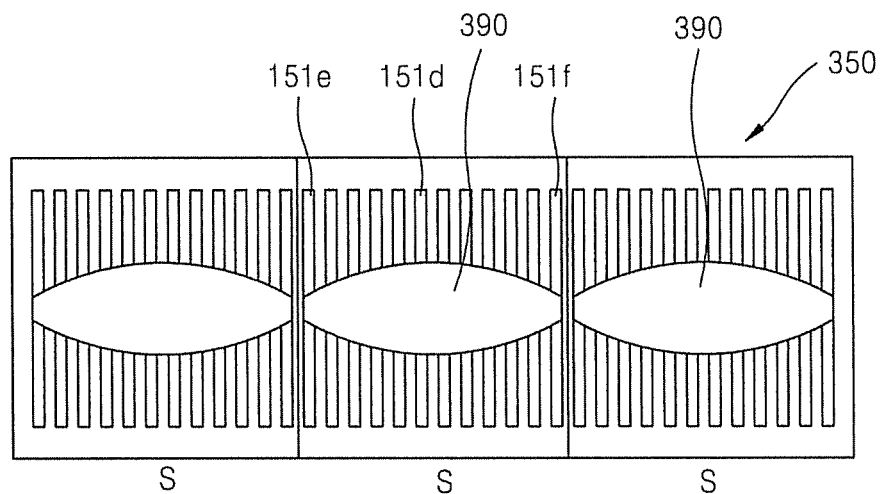
FIG. 12 is a plan view of a patterning slit sheet of the thin film deposition apparatus of FIG. 3, according to another embodiment of the present invention.

FIG. 12 is a plan view of a patterning slit sheet 350 of the thin film deposition apparatus of FIG. 3, according to another embodiment of the present invention. Referring to FIG. 12, the patterning slit sheet 350 may include a correction plate 390. The correction plate 390 may be disposed in such a way that approximately arcs or cosine curves are combined with each other between adjacent barrier plates (see 131 of FIG. 3) in a vertical direction. The correction plate 390 blocks a portion of deposition material incident on a patterning slit (see 151 of FIG. 1) from a deposition source nozzle (see 121 of FIG. 1).

Specifically, center portions of a thin film deposited by the thin film deposition apparatus have a convex shape, and thus, in order to make the thicknesses of the portions of the deposited thin film uniform, some deposition material toward the central portion of each sub-deposition space S needs to be blocked. Thus, the correction plate 390 is disposed in the middle of a path on which the deposition material moves so as to block a portion of deposition material. In this case, since the correction plate 390 is disposed in such a way that arcs or cosine curves are combined with each other in a vertical direction, a large amount of deposition material collides against a relatively protruding central portion so that a larger amount of deposition material may be blocked, and a smaller amount of deposition material collides against an edge portion of each sub-deposition space S so that a smaller amount of deposition material may be blocked. In this case, the correction plate 390 may be disposed so that a portion of each sub-deposition space S in which the thickness of a portion of a deposited thin film is the smallest, generally, the thickness of a portion of a thin film deposited at both ends of each sub-deposition space S may be the overall thin film thickness.

Accordingly, the correction plate 390 is disposed on a moving path of the deposition material so that a thin film deposited by the thin film deposition apparatus of FIG. 3 may be corrected in the shape of the line B of FIG. 7. In other words, the amount of deposition may be corrected so that the overall thickness of the deposited thin film may be uniform, in such a way that so the height of the correction plate 390 is large in a portion of each sub-deposition space S in which a large amount of deposition material is deposited, so that a large amount of deposition material may be blocked and the height of the correction plate 390 is small in a portion of each sub-deposition space S in which a small amount of deposition material is deposited, so that a small amount of deposition material may be blocked.

The thickness uniformity of a thin film deposited on a substrate according to an embodiment the present invention has an error range of 1% to 2%, and thus the quality and reliability of a structure including the substrate on which the thin film is formed may be improved.

Figure 13:
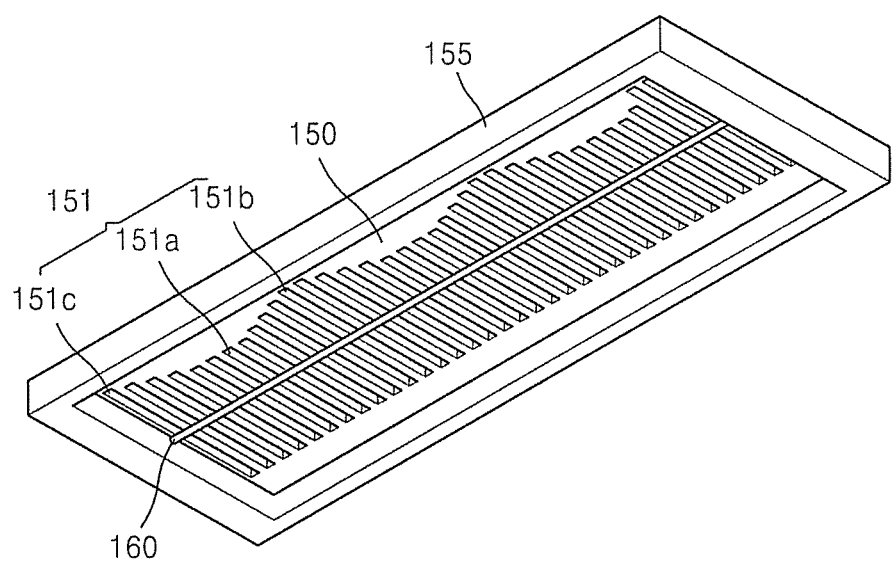
FIG. 13 is a rear perspective view of a patterning slit sheet of the thin film deposition apparatus of FIG. 3, according to another embodiment of the present invention.

FIG. 13 is a rear perspective view of a patterning slit sheet 150 of the thin film deposition apparatus 100 of FIG. 3, according to another embodiment of the present invention. Referring to FIG. 13, a support member 160 is disposed at a rear side of the patterning slit sheet 150 and supports the patterning slit sheet 150. The support member 160 prevents the patterning slit sheet 150 from sagging toward a deposition source (see 110 of FIG. 1). The support member 160 may be rod-shaped. The support member 160 may cross the lengthwise direction of a plurality of patterning slit 151s of the patterning slit sheet 150, and in an embodiment of the present invention, the lengthwise direction of the support member 160 may be perpendicular to the lengthwise direction of the patterning slits 151. Both ends of the support member 160 may be fixed on a frame 155 in which the patterning slit sheet 150 is bound.

Figure 14:
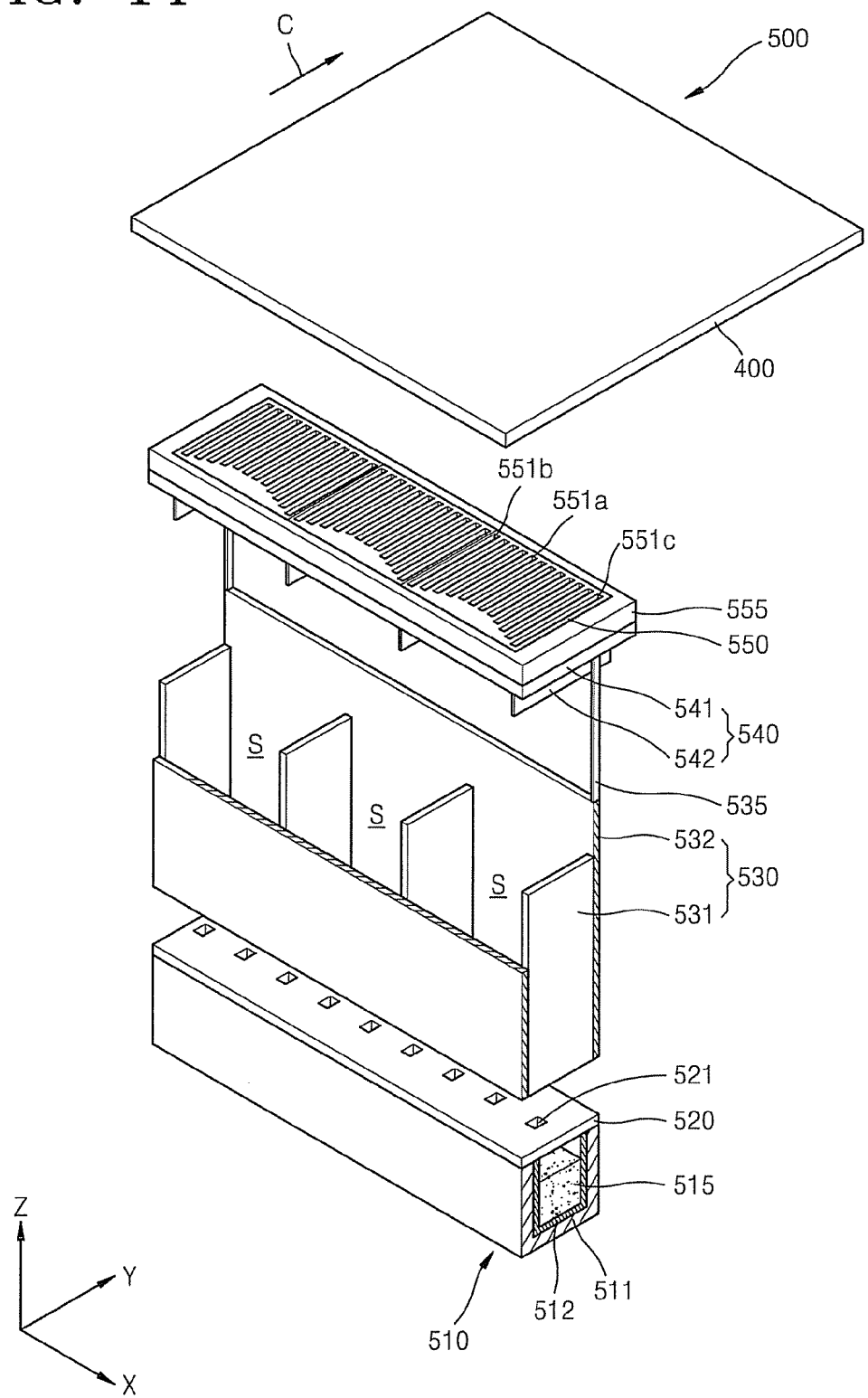
FIG. 14 is a schematic perspective view of a thin film deposition apparatus according to another embodiment of the present invention.

FIG. 14 is a schematic perspective view of a thin film deposition apparatus 500 according to another embodiment of the present invention. Referring to FIG. 14, the thin film deposition apparatus 500 includes a deposition source 510, a deposition source nozzle unit 520, a first barrier plate assembly 530, a second barrier plate assembly 540, and a patterning slit sheet 550.

Although a chamber is not illustrated in FIG. 14 for convenience of explanation, all the components of the thin film deposition apparatus 500 may be disposed within a chamber that is maintained at an appropriate degree of vacuum. The chamber is maintained at an appropriate vacuum in order to allow a deposition material to move in a substantially straight line through the thin film deposition apparatus 500.

The substrate 400, which constitutes a target on which a deposition material 515 is to be deposited, may be disposed in the chamber. The deposition source 510 that contains and heats the deposition material 515 may be disposed in an opposite side of the chamber to the side in which the substrate 400 is disposed. The deposition source 510 may include a crucible 511 and a heater 512.

The deposition source nozzle unit 520 may be disposed at a side of the deposition source 510, and in particular, at the side of the deposition source 510 facing the substrate 400. The deposition source nozzle unit 520 may include a plurality of deposition source nozzles 521 arranged in the X-axis direction.

The first barrier plate assembly 530 may be disposed at a side of the deposition source nozzle unit 520. The first barrier plate assembly 530 may include a plurality of first barrier plates 531, and a first barrier plate frame 532 that covers sides of the first barrier plates 531.

The second barrier plate assembly 540 may be disposed at a side of the first barrier plate assembly 530. The second barrier plate assembly 540 includes a plurality of second barrier plates 541, and a second barrier plate frame 542 that covers sides of the second barrier plates 541.

The patterning slit sheet 550 and a frame 555 in which the patterning slit sheet 550 is bound may be disposed between the deposition source 510 and the substrate 400. The frame 555 may be formed in a lattice shape, similar to a window frame. The patterning slit sheet 550 includes a plurality of patterning slits 551*a*, 551*b*, and 551*c* arranged in the X-axis direction.

The thin film deposition apparatus 500 includes two separate barrier plate assemblies, i.e., the first barrier plate assembly 530 and the second barrier plate assembly 540, unlike the thin film deposition apparatus 100 illustrated in FIG. 3, which includes one barrier plate assembly 130.

The plurality of first barrier plates 531 may be arranged parallel to each other at equal intervals in the X-axis direction. In addition, each of the first barrier plates 531 may be formed to extend along an YZ plane in FIG. 10, i.e., perpendicular to the X-axis direction.

The plurality of second barrier plates 541 may be arranged parallel to each other at equal intervals in the X-axis direction. In addition, each of the second barrier plates 541 may be formed to extend in the YZ plane in FIG. 10, i.e., perpendicular to the X-axis direction.

The plurality of first barrier plates 531 and second barrier plates 541 arranged as described above partition the space between the deposition source nozzle unit 520 and the patterning slit sheet 550. In the thin film deposition apparatus 500, the deposition space is divided by the first barrier plates 531 and the second barrier plates 541 into sub-deposition spaces that respectively correspond to the deposition source nozzles 521 through which the deposition material 515 is discharged.

The second barrier plates 541 may be disposed to correspond respectively to the first barrier plates 531. In other words, the second barrier plates 541 may be respectively disposed to be parallel to and to be on the same plane as the first barrier plates 531. Each pair of the corresponding first and second barrier plates 531 and 541 may be located on the same plane. As described above, since the space between the deposition source nozzle unit 520 and the patterning slit sheet 550, which will be described later, is partitioned by the first barrier plates 531 and the second barrier plates 541, which are disposed parallel to each other, the deposition material 515 discharged through one of the deposition source nozzles 521 is not mixed with the deposition material 515 discharged through the other deposition source nozzles 521, and is deposited on the substrate 400 through the patterning slits 551. In other words, the first barrier plates 531 and the second barrier plates 541 guide the deposition material 515, which is discharged through the deposition source nozzles 521, not to flow in the X-axis direction.

Although the first barrier plates 531 and the second barrier plates 541 are respectively illustrated as having the same thickness in the X-axis direction, aspects of the present invention are not limited thereto. In other words, the second barrier plates 541, which need to be accurately aligned with the patterning slit sheet 550, may be formed to be relatively thin, whereas the first barrier plates 531, which do not need to be precisely aligned with the patterning slit sheet 550, may be formed to be relatively thick. This makes it easier to manufacture the thin film deposition apparatus 500.

Figure 15:
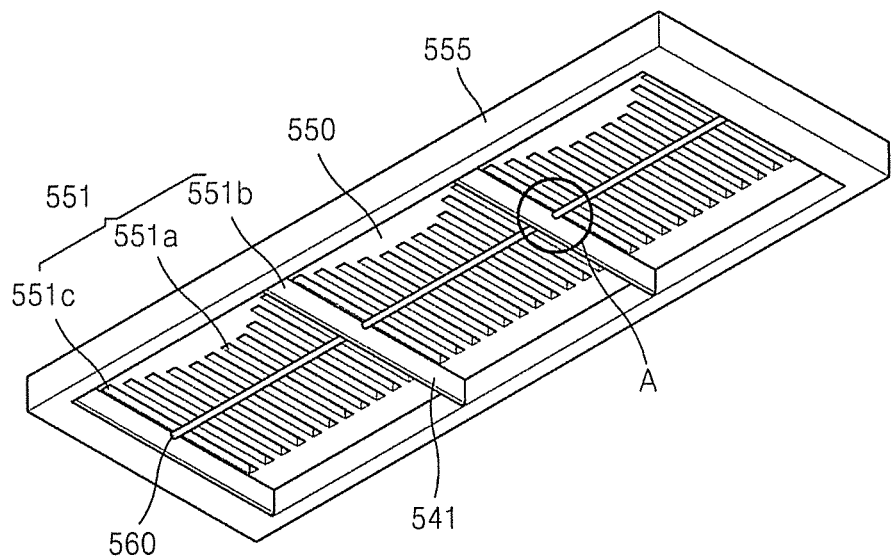
FIG. 15 is a rear perspective view of a patterning slit sheet of the thin film deposition apparatus of FIG. 14, according to an embodiment of the present invention.

FIG. 15 is a rear perspective view of the patterning slit sheet 550 of the thin film deposition apparatus 500 of FIG. 14, according to an embodiment of the present invention. Referring to FIG. 15, a support member 560 may be disposed at a rear side of the patterning slit sheet 550. The support member 560 prevents the patterning slit sheet 550 from sagging toward the deposition source 510. The support member 560 may be rod-shaped. The support member 560 may cross the lengthwise direction of the patterning slits 551, and in an embodiment of the present invention, the lengthwise direction of the support member 560 may be perpendicular to the lengthwise direction of the patterning slits 551. Both ends of the support member 560 may be fixed on a frame 555 in which the patterning slit sheet 550 is bound.

Figure 16:
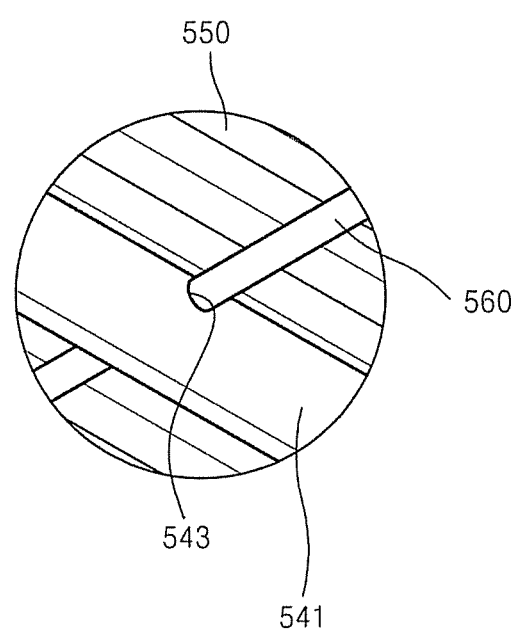
FIG. 16 is an enlarged view of A of FIG. 15, according to an embodiment of the present invention.

Also, the support member 560 may be supported by the second barrier plates 541. FIG. 16 is an enlarged view of portion A of FIG. 15. Referring to FIG. 16, a through hole 543 is formed in each of the second barrier plates 541. The support member 560 may support the patterning slit sheet 550 through the through holes 543.

Lengths of patterning slits 551a, 551b, and 551c of the patterning slit sheet 550, which correspond to each sub-deposition space S, are different from one another in order to obtain thickness uniformity of a deposited thin film, as described above. In this regard, the patterning sheet 551a disposed in the centre of each sub-deposition space S has the minimum length of the patterning slits 551, and the farther the patterning slits 551 from a centre of each sub-deposition space S, the greater the length of the patterning slits 551. Thus, the patterning slits 551b and 551c that correspond to both ends of each sub-deposition space S have the maximum length of the patterning slits 551.

Figure 17:
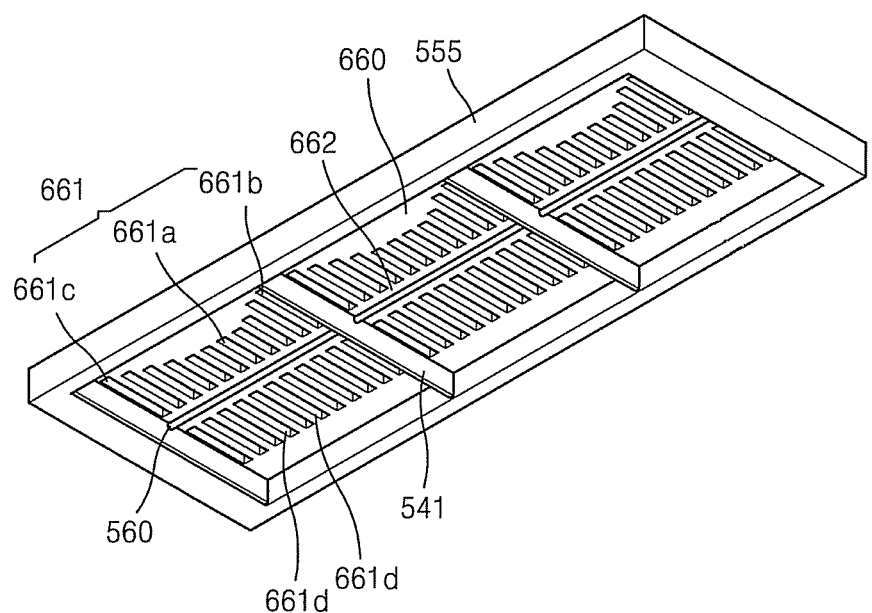
FIG. 17 is a rear perspective view of a patterning slit sheet of a thin film deposition apparatus of FIG. 14, according to another embodiment of the present invention.

FIG. 17 is a rear perspective view of a patterning slit sheet 660 of the thin film deposition apparatus 500 of FIG. 14, according to another embodiment of the present invention. Referring to FIG. 17, the patterning slit sheet 660 of FIG. 17 is the same as the patterning slit sheet 560 of FIG. 16 in that the support member 560 supports the patterning slit sheet 660. However, slits are not formed in a portion 662 of the patterning slit sheet 660 in which the support member 560 is disposed. In this manner, since slits are not formed in the portion 662 of the patterning slit sheet 660 in which the support member 560 is disposed, the possibility that a thin film may be formed due to a deposition material discharged between the support member 560 and the patterning slit sheet 660 may be reduced.

Slits 661d formed on one side of the portion 662 of the patterning slit sheet 660 of FIG. 7 in which the support member 560 is disposed may have the same lengths, and slits 661 formed on the other side of the portion 662 of the patterning slit sheet 660 of FIG. 7 in which the support member 560 is disposed may have different lengths. In other words, the farther the slits 661 from the slit 661a disposed at the central portion of each sub-deposition space S, the greater the lengths of the slits 661. In this regard, the slits 661b and 661c disposed at both ends of each sub-deposition space S may have the maximum length among the slits 661. In this manner, the lengths of the slits 661 may be different from one another so that the thicknesses of portions of a deposited thin film may be uniform, as described above.

Figure 18:
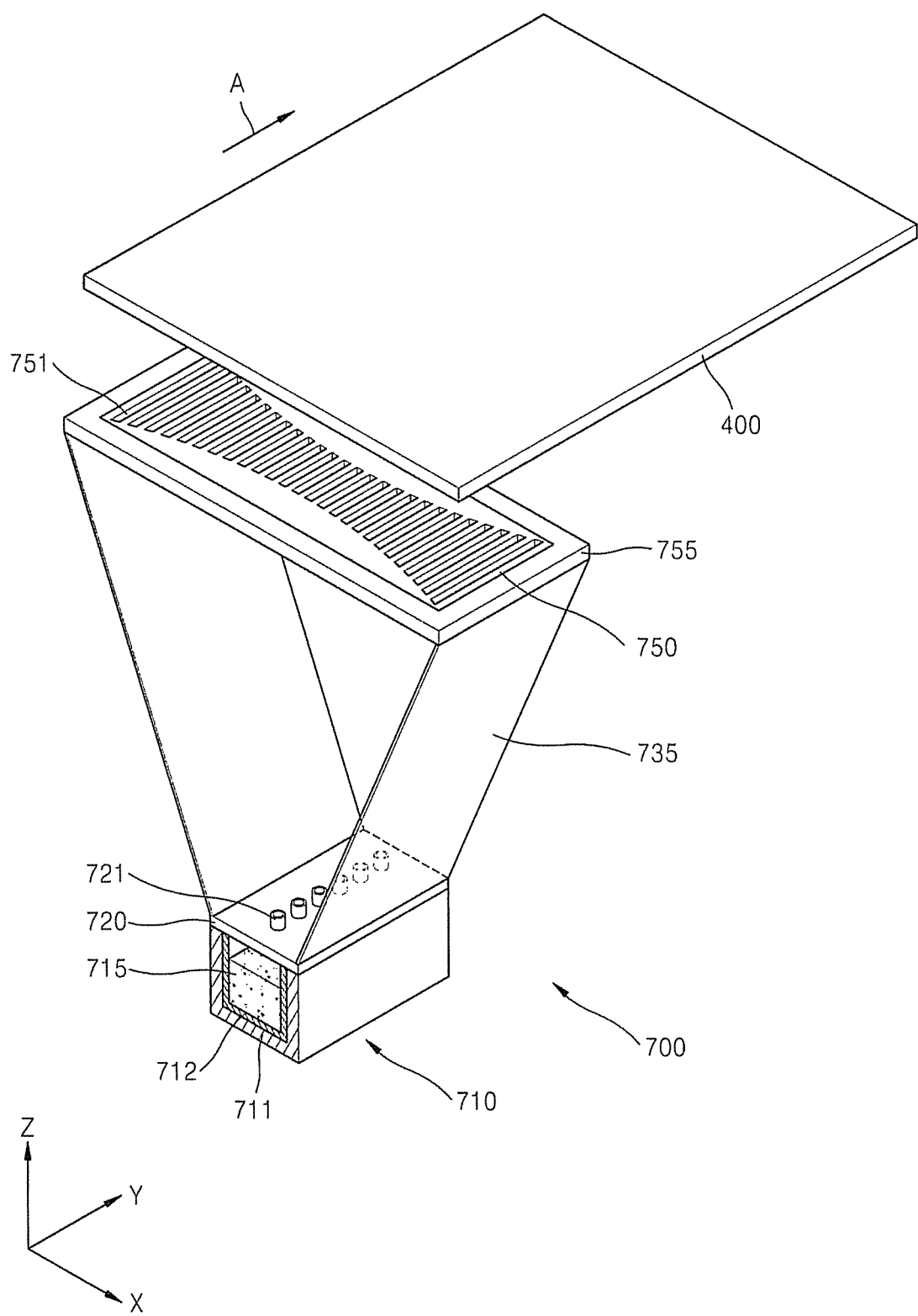
FIG. 18 is a schematic perspective view of a thin film deposition apparatus according to another embodiment of the present invention.
Figure 19:
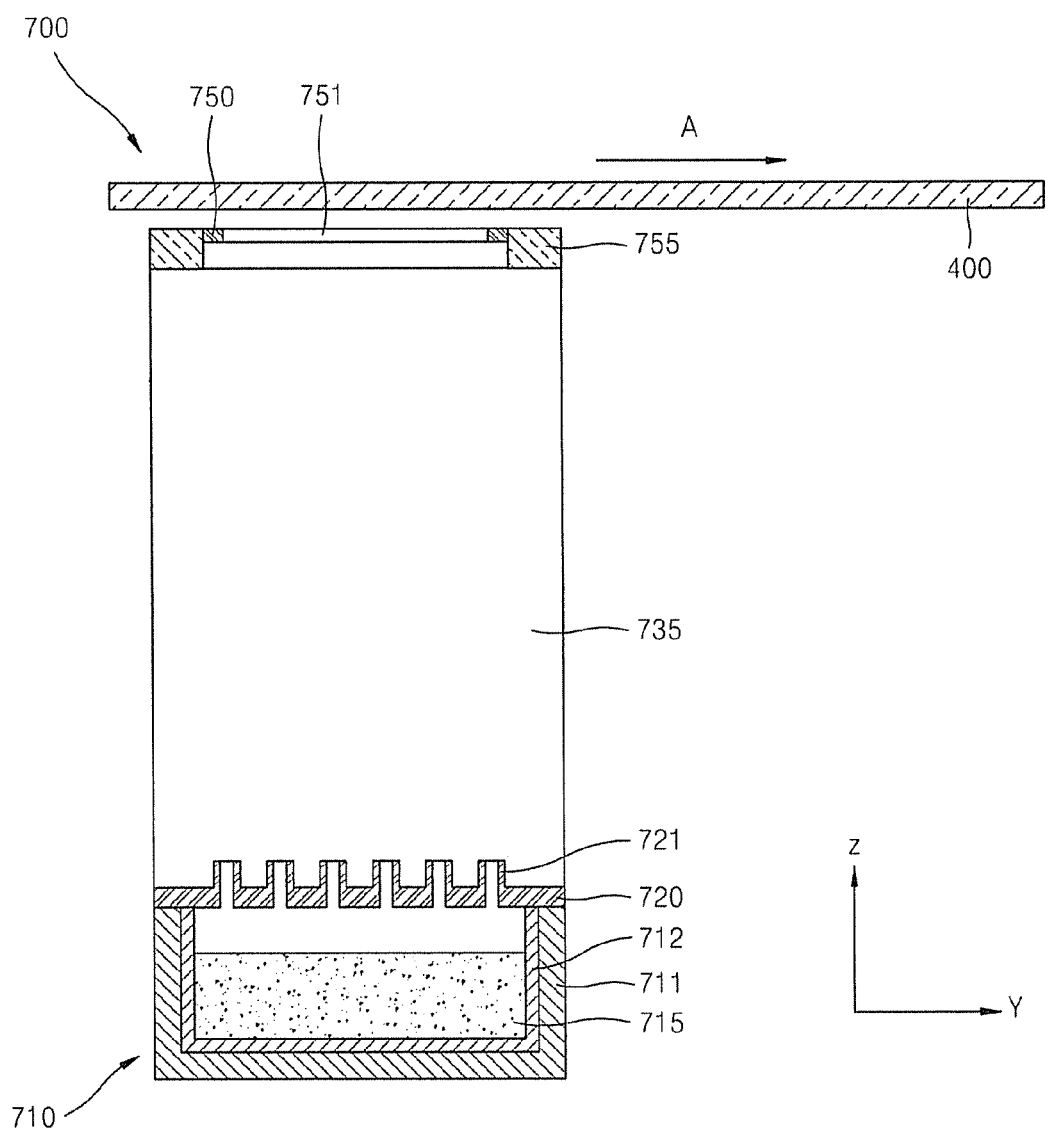
FIG. 19 is a schematic side view of the thin film deposition apparatus of FIG. 18, according to an embodiment of the present invention.
Figure 20:
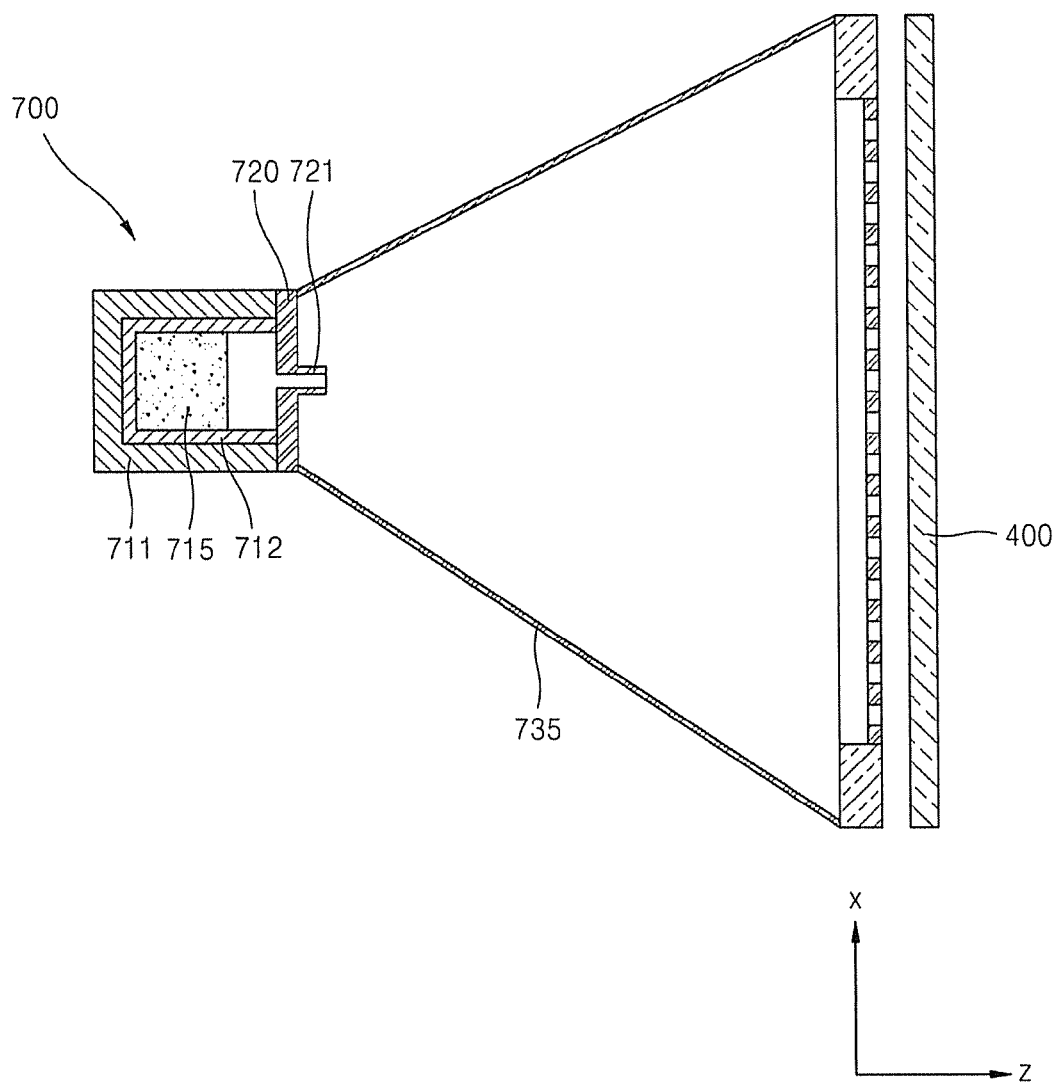
FIG. 20 is a schematic plan view of the thin film deposition apparatus of FIG. 18, according to an embodiment of the present invention.

FIG. 18 is a schematic perspective view of a thin film deposition apparatus 700 according to an embodiment of the present invention, FIG. 19 is a schematic side view of the thin film deposition apparatus 700 of FIG. 18, according to an embodiment of the present invention, and FIG. 20 is a schematic plan view of the thin film deposition apparatus 700 of FIG. 18, according to an embodiment of the present invention.

Referring to FIGS. 18, 19, and 20, the thin film deposition apparatus 700 according to an embodiment of the present invention includes a deposition source 710, a deposition source nozzle unit 720, and a patterning slit sheet 750.

Although a chamber is not illustrated in FIGS. 18, 19 and 20 for convenience of explanation, all the components of the thin film deposition apparatus 700 may be disposed within a chamber that is maintained at an appropriate degree of vacuum. The chamber is maintained at an appropriate vacuum in order to allow a deposition material to move in a substantially straight line through the thin film deposition apparatus 700.

In particular, in order to deposit a deposition material 715 that is discharged from the deposition source 710 and is discharged through the deposition source nozzle unit 720 and the patterning slit sheet 750, onto a substrate 400 in a desired pattern, the chamber should be maintained in a high-vacuum state as in a deposition method using a fine metal mask (FMM). In addition, the temperature of the patterning slit sheet 750 should be sufficiently lower than the temperature of the deposition source 710. In this regard, the temperature of the patterning slit sheet 150 may be about 100° C. or less. The temperature of the patterning slit sheet 750 should be sufficiently low so as to reduce thermal expansion of the patterning slit sheet 750.

The substrate 400, which constitutes a target on which a deposition material 715 is to be deposited, is disposed in the chamber. The substrate 400 may be a substrate for flat panel displays. A large substrate, such as a mother glass, for manufacturing a plurality of flat panel displays, may be used as the substrate 400. Other substrates may also be employed.

The deposition may be performed while the substrate 400 or the thin film deposition apparatus 700 is moved relative to each other.

In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition apparatus 700, deposition may be performed while the thin film deposition apparatus 700 or the substrate 400 is moved relative to each other. In other words, deposition may be continuously performed while the substrate 400, which is disposed such as to face the thin film deposition apparatus 700, is moved in a Y-axis direction. In other words, deposition is performed in a scanning manner while the substrate 400 is moved in a direction of arrow A in FIG. 18. Although the substrate 400 is illustrated as being moved in the Y-axis direction in FIG. 3 when deposition is performed, aspects of the present invention are not limited thereto. Deposition may be performed while the thin film deposition apparatus 700 is moved in the Y-axis direction, whereas the substrate 400 is fixed.

Thus, in the thin film deposition apparatus 700 according to an embodiment of the present invention, the patterning slit sheet 750 may be significantly smaller than an FMM used in a conventional deposition method. In other words, in the thin film deposition apparatus 700, deposition is continuously performed, i.e., in a scanning manner while the substrate 400 is moved in the Y-axis direction. Thus, lengths of the patterning slit sheet 750 in the X-axis and Y-axis directions may be significantly less than the lengths of the substrate 400 in the X-axis and Y-axis directions. As described above, since the patterning slit sheet 750 may be formed to be significantly smaller than an FMM used in a conventional deposition method, it is relatively easy to manufacture the patterning slit sheet 750. The use of the patterning slit sheet 750, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition apparatus 700 or the substrate 400 is moved relative to each other as described above, the thin film deposition apparatus 700 and the substrate 400 may be separated from each other by a predetermined distance. This will be described later in detail.

The deposition source 710 that contains and heats the deposition material 715 is disposed in an opposite side of the chamber to the side in which the substrate 400 is disposed. As the deposition material 715 contained in the deposition source 710 is vaporized, the deposition material 715 is deposited on the substrate 400.

The deposition source 710 includes a crucible 711 and a heater 712. The crucible 711 holds the deposition material 715. The heater 712 heats the crucible 711 to vaporize the deposition material 715 contained in the crucible 711 towards a side of the crucible 711, and in particular, towards the deposition source nozzle unit 720.

The deposition source nozzle unit 720 is disposed at a side of the deposition source 710 facing the substrate 400. The deposition source nozzle unit 720 includes a plurality of deposition source nozzles 721 in the Y-axis direction, that is, a scanning direction of the substrate 400. The plurality of deposition source nozzles 721 may be arranged at equal intervals in the Y-axis direction. The deposition material 715 that is vaporized in the deposition source 710 passes through the deposition source nozzle unit 720 towards the substrate 400 on which the deposition material 715 is deposited. As described above, when the plurality of deposition source nozzles 721 are formed on the deposition source nozzle unit 720 in the Y-axis direction, that is, the scanning direction of the substrate 400, the size of the pattern formed by the deposition material 715 that is discharged through each of patterning slits 151 in the patterning slit sheet 750 is only affected by the size of one deposition source nozzle 721, that is, it may be considered that one deposition nozzle 721 exists in the X-axis direction, and thus there is no shadow zone on the substrate 400. In addition, since the plurality of deposition source nozzles 721 are formed in the scanning direction of the substrate 400, even though there is a difference between fluxes of the deposition source nozzles 121, the difference may be compensated and deposition uniformity may be maintained constantly.

The patterning slit sheet 750 and a frame 755 in which the patterning slit sheet 750 is bound are disposed between the deposition source 710 and the substrate 400. The frame 755 may be formed in a lattice shape, similar to a window frame. The patterning slit sheet 750 is bound inside the frame 755. The patterning slit sheet 750 includes a plurality of patterning slits 751 arranged in the X-axis direction. The deposition material 715 that is vaporized in the deposition source 710 passes through the deposition source nozzle unit 720 and the patterning slit sheet 750 towards the substrate 400. The patterning slit sheet 750 may be manufactured by etching, which is the same method as used in a conventional method of manufacturing an FMM, and in particular, a striped FMM. Here, the total number of patterning slits 751 may be greater than the total number of deposition source nozzles 721.

In addition, the deposition source 710 (and the deposition source nozzle unit 720 coupled to the deposition source 710) and the patterning slit sheet 750 may be formed to be separated from each other by a predetermined distance. Alternatively, the deposition source 710 (and the deposition source nozzle unit 720 coupled to the deposition source 710) and the patterning slit sheet 750 may be connected by connection members 735. That is, the deposition source 710, the deposition source nozzle unit 720, and the patterning slit sheet 750 may be connected to each other via the connection members 735 and may be formed integrally with each other. Each of the connection members 735 guides the deposition material 715, which is discharged through the deposition source nozzles 721, to move straight, not to flow in the X-axis direction. In FIGS. 18 through 20, the connection members 735 are formed on left and right sides of the deposition source 710, the deposition source nozzle unit 720, and the patterning slit sheet 750 to guide the deposition material 715 not to flow in the X-axis direction, however, aspects of the present invention are not limited thereto. That is, the connection members 735 may be formed as a sealed type of a box shape to guide flow of the deposition material 715 in the X-axis and Y-axis directions, but the invention is not limited thereto.

As described above, the thin film deposition apparatus 700 performs deposition while being moved relative to the substrate 400. In order to move the thin film deposition apparatus 700 relative to the substrate 400, the patterning slit sheet 750 is separated from the substrate 400 by a predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask should be the same as the size of the substrate since the mask cannot be moved relative to the substrate. Thus, the size of the mask should be increased as display devices become larger. However, it is not easy to manufacture such a large mask.

In order to overcome this problem, in the thin film deposition apparatus 700 according to an embodiment of the present invention, the patterning slit sheet 750 is disposed to be separated from the substrate 400 by a predetermined distance.

As described above, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

Figure 21:
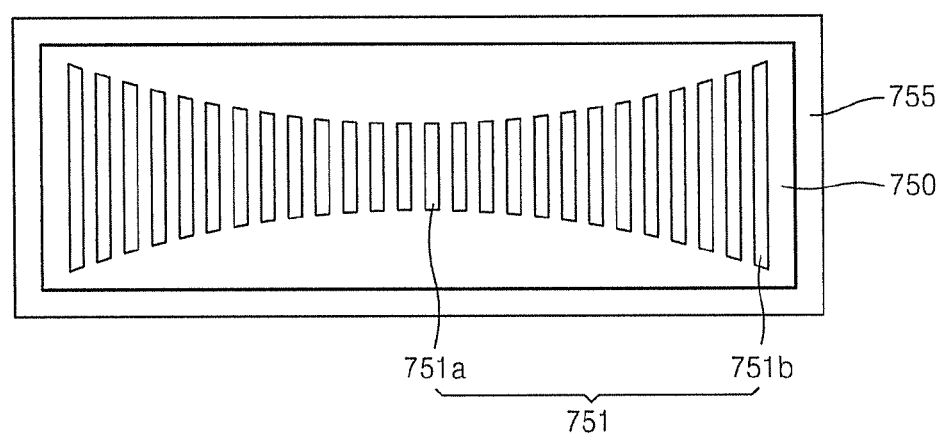
FIG. 21 is a plan view of a patterning slit sheet of the thin film deposition apparatus of FIG. 18, according to an embodiment of the present invention.

FIG. 21 is a plan view of a patterning slit sheet of the thin film deposition apparatus 700 of FIG. 18, according to an embodiment of the present invention. Referring to FIG. 21, a length of a patterning slit 751a located at a center portion of the patterning slit sheet 750 is less than a length of patterning slits 151b located at both end portions of the patterning slit sheet 750 in order to ensure uniformity of the thin film formed on the substrate 400. In discharging an organic material (deposition material), the largest amount of organic material is discharged through a portion that is perpendicular to the deposition source nozzles 721 (see FIG. 18) and the amount of discharged organic material is gradually reduced towards both ends of the patterning slit sheet 750 according to the cosine law. Thus, in the thin film deposition apparatus 700 including the patterning slits 751 having the same lengths, deposited thin films having a bulgy center portion may be formed.

In order to prevent thickness non-uniformity of a deposited thin film described above, a length of patterning slit 751a located at the center portion of the patterning slit sheet 750 is less than those of patterning slits 751b located at both end portions of the patterning slit sheet 750. In other words, the length of the patterning slit 751a located at the center portion of the patterning slit sheet 750 is the smallest, and the length of the patterning slit 751b located at both end portions of the patterning slit sheet 750 is the longest. The patterning slit sheet 750 including the patterning slits 751a and 751b having different lengths block some of the deposition material 715 discharged from the deposition source nozzles 721 (see FIG. 18) towards the patterning slits 751 (see FIG. 18).

In detail, since the deposited thin films formed by the thin film deposition apparatus 700 have a bulgy center portion, some of the deposition material 715 discharged towards the center portion of the patterning slit sheet 750 should be blocked in order to form the deposited thin films to have a uniform thickness. Here, since the length of the patterning slit 751a located at the center portion of the patterning slit sheet 750 is less than the length of the patterning slits 751b located at both end portions of the patterning slit sheet 750, the deposition material 715 discharged towards the center portion of the patterning slit sheet 750 is blocked more than the deposition material 715 discharged towards left and right side portions of the patterning slit sheet 750, and the deposition material 715 discharged towards left and right side portions of the patterning slit sheet 750 are blocked less than the deposition material 715 discharged towards the center portion of the patterning slit sheet 750.

As described above, since the patterning slits 751 are formed to have different lengths on the flowing path of the deposition material 715, the deposited thin films formed by the thin film deposition apparatus 700 may be corrected. That is, the length of the patterning slit 751a is the smallest at a portion of the substrate 400 on which a lot of deposition material 715 is deposited, to block a lot of deposition material 715, and the lengths of the patterning slits 751b are the longest at portions of the substrate 400 on which less deposition material 715 is deposited, to block less deposition material 715. Thus, the deposition amount of the deposition material 715 may be adjusted so that thicknesses of the deposited thin films may be uniform.

In the thin film deposition apparatus 700, the uniformity of the thin film formed on the substrate 400 is within an error range of about 1 to about 2%, and thus, quality and reliability of the thin film deposition apparatus 700 may be improved.

Figure 22:
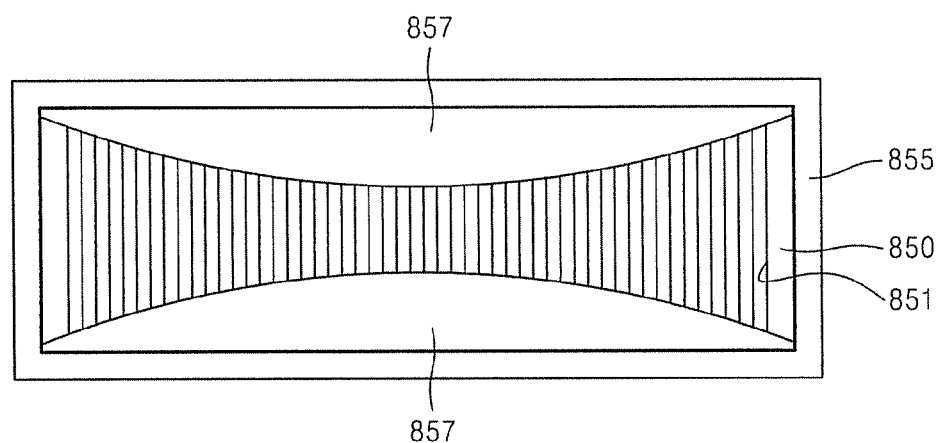
FIG. 22 is a plan view of a patterning slit sheet of the thin film deposition apparatus of FIG. 18, according to another embodiment of the present invention.

FIG. 22 is a plan view of a patterning slit sheet 850 of the thin film deposition apparatus 700 of FIG. 18, according to another embodiment of the present invention. A correction plate 857 is further disposed at a side of the patterning slit sheet 850.

In particular, a thin film deposition apparatus of an embodiment of the present invention may further include the correction plate 857 in order to ensure uniformity of a thin film formed on the substrate 400. In discharging an organic material (deposition material), the largest amount of organic material is discharged through a portion that is perpendicular to the deposition source nozzles 721 (see FIG. 18) and the amount of discharged organic material is gradually reduced towards both ends of the patterning slit sheet 850 according to cosine law. Thus, in a thin film deposition apparatus that does not include the correction plate, deposited thin films having a bulgy center portion may be formed.

In order to prevent thickness non-uniformity of a deposited thin film described above, the correction plate 857 as shown in FIG. 22 may be disposed at a side of the patterning slit sheet 850. The correction plate 857 is formed on a surface of the patterning slit sheet 850 as a circular arc or a cosine curve. The correction plate 857 blocks some of the deposition material discharged from the deposition source nozzles 721 (see FIG. 18) towards the patterning slits 751 (see FIG. 18).

That is, since the deposited thin films formed by the thin film deposition apparatus 700 has a bulgy center portion, some of the deposition material discharged towards the center portion of the patterning slit sheet 850 should be blocked in order to form the deposited thin films to have a uniform thickness. Therefore, the correction plate 857 is disposed on the way of the deposition material in order to block some of the deposition material. Here, since the correction plate 857 is formed to have the circular arc or the cosine curve shape, the deposition material discharged towards the relatively-protruding center portion of the patterning slit sheet 850 is blocked more than the deposition material discharged towards left and right side portions of the patterning slit sheet 850, and the deposition material discharged towards left and right side portions of the patterning slit sheet 850 is blocked less than the deposition material discharged towards the center portion of the patterning slit sheet 850. In this regard, the correction plate 857 may be formed so that a uniform thickness of a thin film formed of the deposition material discharged towards a portion where the thickness of a film is the smallest, generally, both ends of the patterning slit sheet 850, is obtained.

As described above, since the correction plate 857 is disposed on the flowing path of the deposition material, the deposited thin films formed by the thin film deposition apparatus 700 may be corrected. That is, a height of the correction plate 857 is increased in order to block a lot of deposition material at the portion where a lot of deposition material is deposited, and the height of the correction plate 857 is reduced in order to block less deposition material at portions where less deposition material is deposited. Thus, the deposition amount of the deposition material may be adjusted so that the thicknesses of the deposited thin films may be uniform.

In the thin film deposition apparatus 700, the uniformity of the thin film formed on the substrate 400 is within an error range of about 1 to about 2%, and thus, quality and reliability of the thin film deposition apparatus 700 may be improved.

Figure 23:
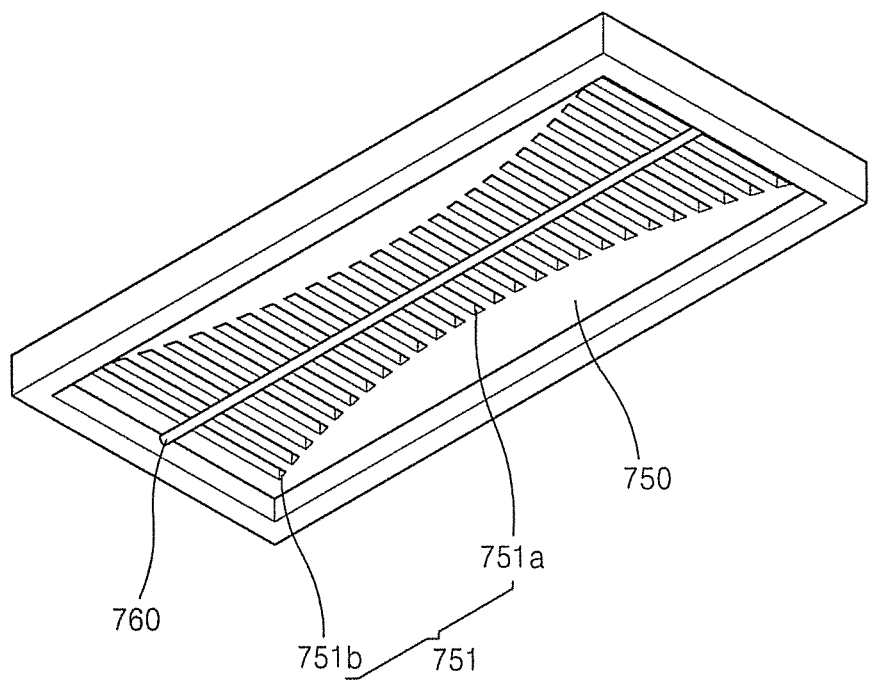
FIG. 23 is a rear perspective view of a patterning slit sheet of the thin film deposition apparatus of FIG. 18, according to another embodiment of the present invention.

FIG. 23 is a rear perspective view of a patterning slit sheet of the thin film deposition apparatus 700 of FIG. 18, according to another embodiment of the present invention. Referring to FIG. 23, a support member 760 for supporting the patterning slit sheet 750 may be disposed at a rear side of the patterning slit sheet 750. The support member 760 may be disposed at the rear side of the patterning slit sheet 750 and may prevent the patterning slit sheet 750 from sagging toward the deposition source 710 (see FIG. 18). The support member 760 may be rod-shaped. The support member 760 may be disposed at the rear side of the patterning slit sheet 750 to cross lengthwise directions of the patterning slits 751. Alternatively, a lengthwise direction of the support member 760 may be disposed to be perpendicular to the lengthwise directions of the patterning slits 751. Both end portions of the support member 760 may be fixed at the frame 755.

Figure 24:
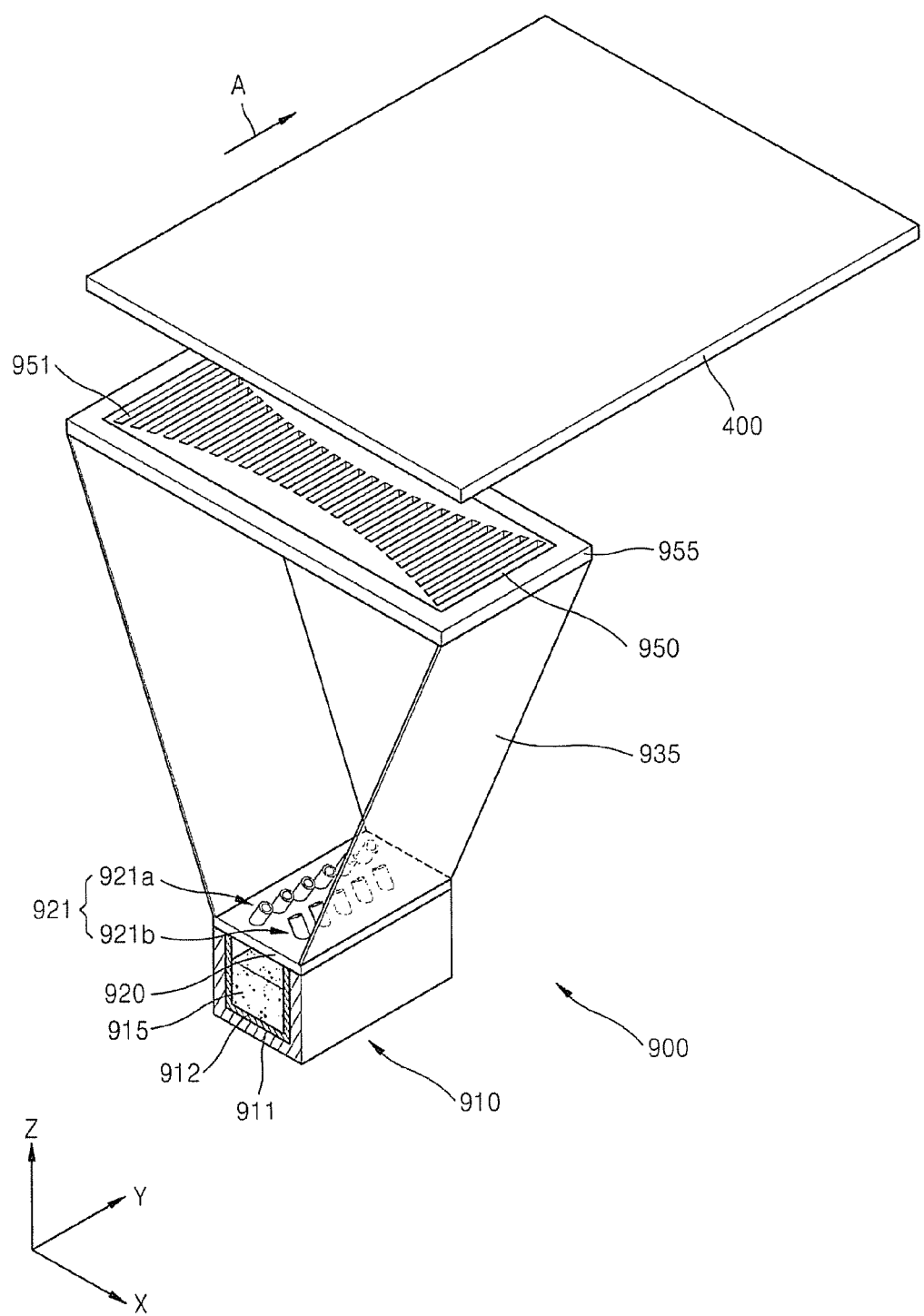
FIG. 24 is a schematic perspective view of a thin film deposition apparatus according to another embodiment of the present invention.

FIG. 24 is a schematic perspective view of a thin film deposition apparatus 900 according to another embodiment of the present invention. Referring to FIG. 24, the thin film deposition apparatus 900 includes a deposition source 910, a deposition source nozzle unit 920, and a patterning slit sheet 950. The deposition source 910 includes a crucible 911 and a heater 912. The crucible 911 holds a deposition material 915. The heater 912 heats the crucible 911 to vaporize the deposition material 915 contained in the crucible 912 towards a side of the crucible 911, and in particular, towards the deposition source nozzle unit 920. The deposition source nozzle unit 920 is disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and the substrate 400, and the patterning slit sheet 950 includes a plurality of patterning slits 951 arranged in the X-axis direction. In addition, the deposition source 910, the deposition source nozzle unit 920, and the patterning slit sheet 950 are connected to each other by a connection member 935.

The plurality of deposition source nozzles 921 formed on the deposition source nozzle unit 920 are tilted at a predetermined angle. In particular, the deposition source nozzles 921 may include deposition source nozzles 921a and 921b which are arranged in two rows, which are alternately arranged with each other. The deposition source nozzles 921a and 921b may be tilted at a predetermined angle on an X-Z plane.

If the lengths of the patterning slits 751 (see FIG. 21) are differentiated from each other or the correction plate 857 (see FIG. 4) is used like in the above described embodiments, an efficiency of utilizing deposition material may be degraded because the deposition material is blocked by the correction plate 857 or the patterning slits 751. Therefore, the deposition source nozzles 921a and 921b are arranged in tilted states at a predetermined angle. Here, the deposition source nozzles 921a in a first row may be tilted toward the deposition nozzles 921b in a second row, and the deposition source nozzles 921b in the second row may be tilted toward the deposition source nozzles 921a in the first row. That is, the deposition source nozzles 921a arranged in the row at the left side of the patterning slit sheet 950 are arranged to face the right side of the patterning slit sheet 950, and the deposition source nozzles 921b arranged in the row at the right side of the patterning slit sheet 950 are arranged to face the left side of the patterning slit sheet 150.

Figure 25:
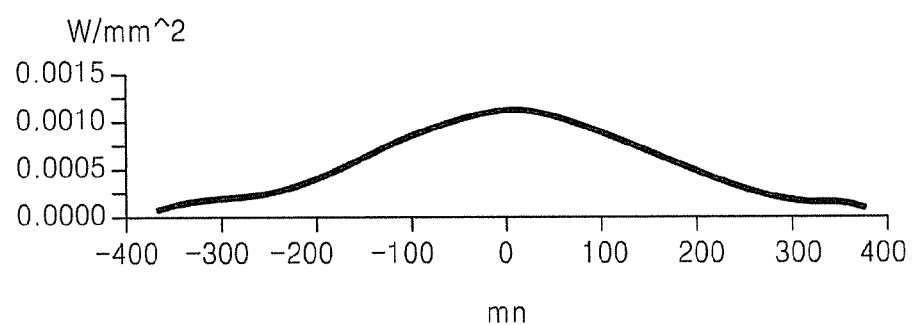
FIG. 25 is a graph schematically illustrating a distribution pattern of a deposited film formed on a substrate when a deposition source nozzle is not tilted, in the thin film deposition apparatus of FIG. 24, according to an embodiment of the present invention.
Figure 26:
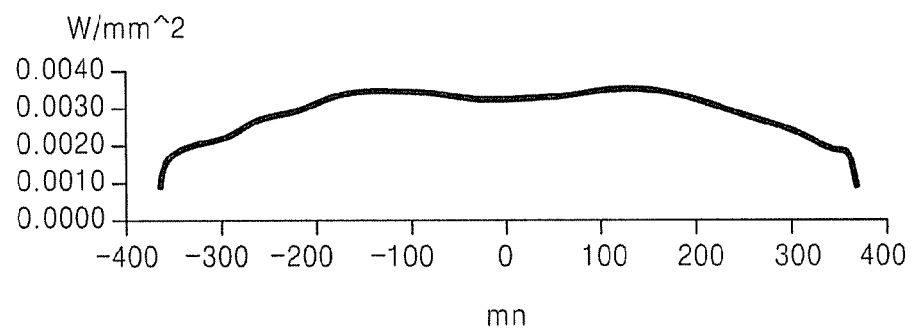
FIG. 26 is a graph schematically illustrating a distribution pattern of a deposited film formed on a substrate when a deposition source nozzle is tilted, in the thin film deposition apparatus of FIG. 24, according to an embodiment of the present invention.

FIG. 25 is a graph schematically illustrating a distribution pattern of a deposited film formed on a substrate when a deposition source nozzle is not tilted, in the thin film deposition apparatus 900 of FIG. 24, according to an embodiment of the present invention, and FIG. 26 is a graph schematically illustrating a distribution pattern of a deposited film formed on a substrate when a deposition source nozzle is tilted, in the thin film deposition apparatus 900 of FIG. 24, according to an embodiment of the present invention. Comparing the graphs of FIGS. 25 and 26 with each other, a thickness of both end portions of the deposited thin film the substrate when the deposition source nozzles are tilted are relatively greater than that of both end portions of the deposited thin film formed on the substrate when the deposition source nozzles are not tilted, and thus, the thickness uniformity of the deposited thin film is improved.

Therefore, the deposition amount of the deposition material may be adjusted so that a difference between the thickness of the center portion of the deposited thin film formed on the substrate and the thickness of end portions of the deposited thin film formed on the substrate may be reduced and the thickness of the deposited thin film may be uniform, and moreover, the efficiency of utilizing the deposition material may be improved.

As described above, the thin film deposition apparatus according to aspects of the present invention may be easily manufactured and may be simply applied to manufacture large-sized display devices on a mass scale. The thin film deposition apparatus may improve manufacturing yield and deposition efficiency, may allow deposition materials to be reused and may improve thickness uniformity of deposited thin films.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting display device by using a thin film deposition apparatus for forming a thin film on a substrate, the method comprising:
    discharging a deposition material from a deposition source of the thin film deposition apparatus;
    passing the discharged deposition material through a deposition source nozzle unit of the thin film deposition apparatus, the deposition source nozzle unit being located at a side of the deposition source and comprising a plurality of deposition source nozzles;
    passing the discharged deposition material through a patterning slit sheet of the thin film deposition apparatus, the patterning slit sheet being disposed opposite to the deposition source nozzle unit and having a plurality of patterning slits, each of the plurality of patterning slits having a length in a first direction and a width in a second direction perpendicular to the first direction, the length of each patterning slit being larger than its width, the plurality of patterning slits being arranged in the second direction, and the length of a patterning slit located at one portion of the patterning slit sheet being different from the length of a patterning slit located at another portion of the patterning slit sheet, the patterning slit sheet having a length in the first direction smaller than a length of the substrate in the first direction, and the patterning slit sheet having a width in the second direction corresponding to a width of the substrate in the second direction;
    arranging the substrate a predetermined distance from and directly adjacent to the patterning slit sheet; and
    depositing the discharged deposition material from the patterning slit sheet onto the substrate,
    the patterning slit sheet providing a plurality of lines of the discharged deposition material along the first direction on the substrate, the plurality of lines of the discharged material being discrete from each other, and the thin film deposition apparatus performing deposition while the thin film deposition apparatus or the substrate is moved relative to each other in the first direction, wherein the deposition source, the deposition source nozzle unit, and the patterning slit sheet are stationary relative to one another during the deposition.

2. The method of claim 1, the depositing of the discharged material on the substrate comprises continuously depositing the discharged material on the substrate while the substrate or the thin film deposition apparatus is moved relative to each other.

3. The method of claim 1, wherein the length of a patterning slit located at a center portion of the patterning slit sheet is shorter than the lengths of pattering slits located at end portions of the patterning slit sheet.

4. The method of claim 1, wherein the farther the patterning slits are from a center of the patterning slit sheet, the greater the lengths of the patterning slits.

5. The method of claim 1, wherein the deposition source and the deposition source nozzle unit, and the patterning slit sheet are connected to each other by a connection member.

6. The method of claim 5, wherein the connection member guides movement of the discharged material.

7. The method of claim 5, wherein the connection member seals a space between the deposition source and the deposition source nozzle unit, and the patterning slit sheet.

8. The method of claim 1, further comprising a support member to support the patterning slit sheet so as to prevent the patterning slit sheet from sagging toward the deposition source.

9. The method of claim 8, wherein the support member crosses a lengthwise direction of the patterning slits.

10. The method of claim 9, wherein the support member extends in the second direction.

11. A method of manufacturing an organic light-emitting display device by using a thin film deposition apparatus for forming a thin film on a substrate, the method comprising:

discharging a deposition material from a deposition source of the thin film deposition apparatus;

passing the discharged deposition material through a deposition source nozzle unit of the thin film deposition apparatus, the deposition source nozzle unit being located at a side of the deposition source and comprising a plurality of deposition source nozzles;

passing the discharged deposition material through a patterning slit sheet of the thin film deposition apparatus, the patterning slit sheet being disposed opposite to the deposition source nozzle unit and having a plurality of patterning slits, each of the plurality of patterning slits having a length in a first direction, the plurality of patterning slits being arranged in a second direction perpendicular to the first direction, the length of a patterning slit located at one portion of the patterning slit sheet being different from the length of a patterning slit located at another portion of the patterning slit sheet;

arranging the substrate a predetermined distance from the patterning slit sheet; and depositing the discharged deposition material from the patterning slit sheet onto the substrate, the patterning slit sheet defining a pattern of deposition material on the substrate, and the thin film deposition apparatus performing deposition while the thin film deposition apparatus or the substrate is moved relative to each other, wherein the thin film deposition apparatus further comprises a barrier plate assembly that is disposed between the deposition source nozzle unit and the patterning slit sheet, the barrier plate assembly comprising a plurality of barrier plates that partition a space between the deposition source nozzle unit and the patterning slit sheet into a plurality of sub-deposition spaces, wherein the length of a patterning slit located at one portion of each of the sub-deposition spaces is different from the length of a patterning slit located at another portion of each of the sub-deposition spaces, and wherein the temperatures of the barrier plates are lower than the temperature of the deposition source nozzle.

12. The method of claim 11, wherein the length of a patterning slit located at a center portion of each of the sub-deposition spaces is shorter than the lengths of pattering slits located at end portions of each of the sub-deposition spaces.

13. The method of claim 11, wherein lengths of the patterning slits that correspond to each sub-deposition space are different from one another.

14. The method of claim 11, wherein the farther the patterning slits are from a center of each sub-deposition space, the greater the lengths of the patterning slits.

15. A method of manufacturing an organic light-emitting display device by using a thin film deposition apparatus for forming a thin film on a substrate, the method comprising:

discharging a deposition material from a deposition source of the thin film deposition apparatus;

passing the discharged deposition material through a deposition source nozzle unit of the thin film deposition apparatus, the deposition source nozzle unit being located at a side of the deposition source and comprising a plurality of deposition source nozzles;

passing the discharged deposition material through a patterning slit sheet of the thin film deposition apparatus, the patterning slit sheet being disposed opposite to the deposition source nozzle unit and having a plurality of patterning slits, each of the plurality of patterning slits having a length in a first direction, the plurality of patterning slits being arranged in a second direction perpendicular to the first direction, the plurality of patterning slits being blocked by a correction plate disposed between the deposition source nozzle unit and the patterning slit sheet so that the correction plate blocks at least some of the discharged material;

arranging the substrate a predetermined distance from the patterning slit sheet; and depositing the discharged deposition material from the patterning slit sheet onto the substrate, the patterning slit sheet defining a pattern of deposition material on the substrate, and the thin film deposition apparatus performing deposition while the thin film deposition apparatus or the substrate is moved relative to each other, wherein the correction plate has a height in the first direction, the height being larger at a center portion of the patterning slit sheet and smaller at end portions of the patterning slit sheet.

16. The method of claim 15, wherein the correction plate has a circular arc shape or a cosine curve shape.

17. The method of claim 15, wherein the correction plate is configured to block more deposition material at the center portion of the patterning slit sheet than the deposition material blocked on end portions of the patterning slit sheet.

* * * * *